United States Patent [19]

Yonekura et al.

[11] 3,848,998

[45] Nov. 19, 1974

[54] APPARATUS FOR THE PRODUCTION OF PHOTOPOLYMER PLATES

[75] Inventors: Saku Yonekura, Tokyo; Hideaki Miyamoto; Akio Namba, both of Yokohama, all of Japan

[73] Assignees: Asahi Kasei Kogyo Kabushiki Kaisha, Osaka; Tokyo Kikai Seisakusho, Ltd., Tokyo, Japan

[22] Filed: May 2, 1973

[21] Appl. No.: 356,532

[30] Foreign Application Priority Data

| | | |
|---|---|---|
| May 2, 1972 | Japan | 47-44054 |
| May 2, 1972 | Japan | 47-44053 |
| May 2, 1972 | Japan | 47-44052 |
| May 2, 1972 | Japan | 47-44051 |
| May 2, 1972 | Japan | 47-44050 |

[52] U.S. Cl. .......................... 355/100, 96/36, 355/85
[51] Int. Cl. .......................... G03b 27/30
[58] Field of Search .......................... 355/100, 85, 99, 97; 354/297; 96/35.1, 36

[56] References Cited

UNITED STATES PATENTS 3,751,164 8/1973 Miller et al. .......................... 355/100

*Primary Examiner*—Richard L. Moses
*Attorney, Agent, or Firm*—Sughrue, Rothwell, Mion, Zinn & Macpeak

[57] ABSTRACT

Apparatus and process for producing a photopolymer plate having relief image areas using a photosensitive material. A protective film, a photosensitive material and a backing material are sequentially supplied to a travelling rigid support plate having an image bearing transparency thereon, and the assembly is exposed to actinic radiation, the protective film is removed off and unexposed non-image areas of the photosensitive material layer are washed out. The resulting photopolymer plate having hardened relief image areas is subjected to a surface treatment, drying and a post-exposure. The apparatus comprises means to automatically accomplish each of the above functions.

12 Claims, 28 Drawing Figures

APPARATUS FOR THE PRODUCTION OF PHOTOPOLYMER PLATES

BACKGROUND

Various apparatuses and processes are already available for producing a photopolymer plate having relief image areas using a photosensitive materials. For example, U.S. Pat. Nos. 3,520,606 and 3,687,785 describe apparatuses relating to the production of a photopolymer plate using a liquid photosensitive material. However, such apparatuses do not cover all steps of producing a photopolymer plate. Namely, using another apparatus the photosensitive material which has been image-wise exposed to actinic radiation must be subjected to various processings such as washing out un-exposed unhardened areas in the exposed photosensitive layer with a liquid and drying the resulting photopolymer and, if necessary, exposing the dried whole photopolymer plate. U.S. Pat. No. 3,635,711 describes an automated apparatus and improvements in a method of operating such an apparatus for processing photocuring a photocuring composition. However, an exposed plate immersed in an etching bath containing a liquid is supported in a vertical position, and then means energizing the etching bath is necessary to remove the un-exposed non-image areas of the plate. If another method of washing-out is used, for example liquid ejection, washing-out can not be completed in the whole surface of the photopolymer plate, especially in the lower surface of the plate, as the plate is supported in a vertical position. The present invention, to the contrary, the photopolymer plate supports the un-exposed non-image areas horizontally so as to be uniformly washed out, without any special apparatus.

SUMMARY OF THE INVENTION

The present invention provides a process and apparatus for the automated production of a photopolymer plate.

The apparatus comprises, in combination, a rigid support plate carrying an image-bearing transparency, which is reciprocable along guide means, the rigid support plate being adapted to apply compressed air or pull a vacuum onto photopolymer plate assembly elements carried thereon, the guide means having a power means to drive the rigid support plate to various processing stations and return it to its start position, the apparatus comprising the following means:

a. means to apply a protective film to the image-bearing transparency on the rigid support plate which means temporarily co-acts with the rigid plate to permit the protective film to be securely, but temporarily, attached to the rigid support plate by a first attaching means on the rigid support plate;

b. means to apply a metered amount of photosensitive material to the protective film, which means is automatically activated by the passage of the rigid support plate;

c. means to feed, cut and laminate a backing material to the photosensitive layer while the photosensitive layer is passing thereunder, which backing material is securely, but temporarily, held to the rigid support plate by a second attaching means which receives the backing material during lamination thereof to the photosensitive layer, and which second attaching means is activated while the rigid support plate is passing means (c);

d. means to image-wise expose the photosensitive layer on the rigid support plate, exposure being from above and below the rigid support plate, this means having a rigid plate through which the above exposure takes places which is lowered onto the rigid plate spaced therefrom by a spacer, the exposure means co-acting with the rigid plate first and second attaching means to sequentially open the same;

e. gripping means which, after exposure, pulls the backing material, exposed photosensitive material and protective film from the rigid support plate, the protective film being slightly separated from the photosensitive material;

f. protective film removing means which removes the protective film from the exposed photosensitive material while carried on the backing material by the gripping means;

g. transfer means which receives the exposed photosensitive material and the backing material from the gripping means and transfers them to h. final element processing means where various processing are applied to the exposed photosensitive layer processings are applied to the exposed photosensitive layer (see steps (g) to (j) below).

The process of the present invention comprises steps equivalent to the above apparatus steps, i.e., a. Applying a protective film to the image-bearing transparency;

b. applying a photosensitive layer to the protective film;

c. laminating the backing material to the photosensitive layer;

d. exposing the photosensitive layer from above and below while a second rigid plate is in spaced contact with the rigid plate carrying the photosensitive layer;

e. removing the protective film, exposed photosensitive material and backing materials from the rigid plate carrying the same;

f. removing the protective film from the exposed photosensitive layer with a liquid;

g. washing out unexposed, unhardened areas in the photosensitive layer with a liquid;

h. treating the thus resulting exposed photosensitive layer with a surface treating agent;

i. drying the resulting photopolymer plate;

j. exposing the dried photopolymer plate to actinic radiation.

Some of the above steps are optional or their order can be reversed, as later explained.

Thus, the primary objects of the present invention are to provide an apparatus and a process for rapidly and efficiently producing polymer plates which require a minimum of operator attention.

DETAILED DESCRIPTION OF THE INVENTION

Figures 1A, 1B, 1C, 1D, 1E, 1F, 1G, 1H, 1I, 1J, 1K, 1L:
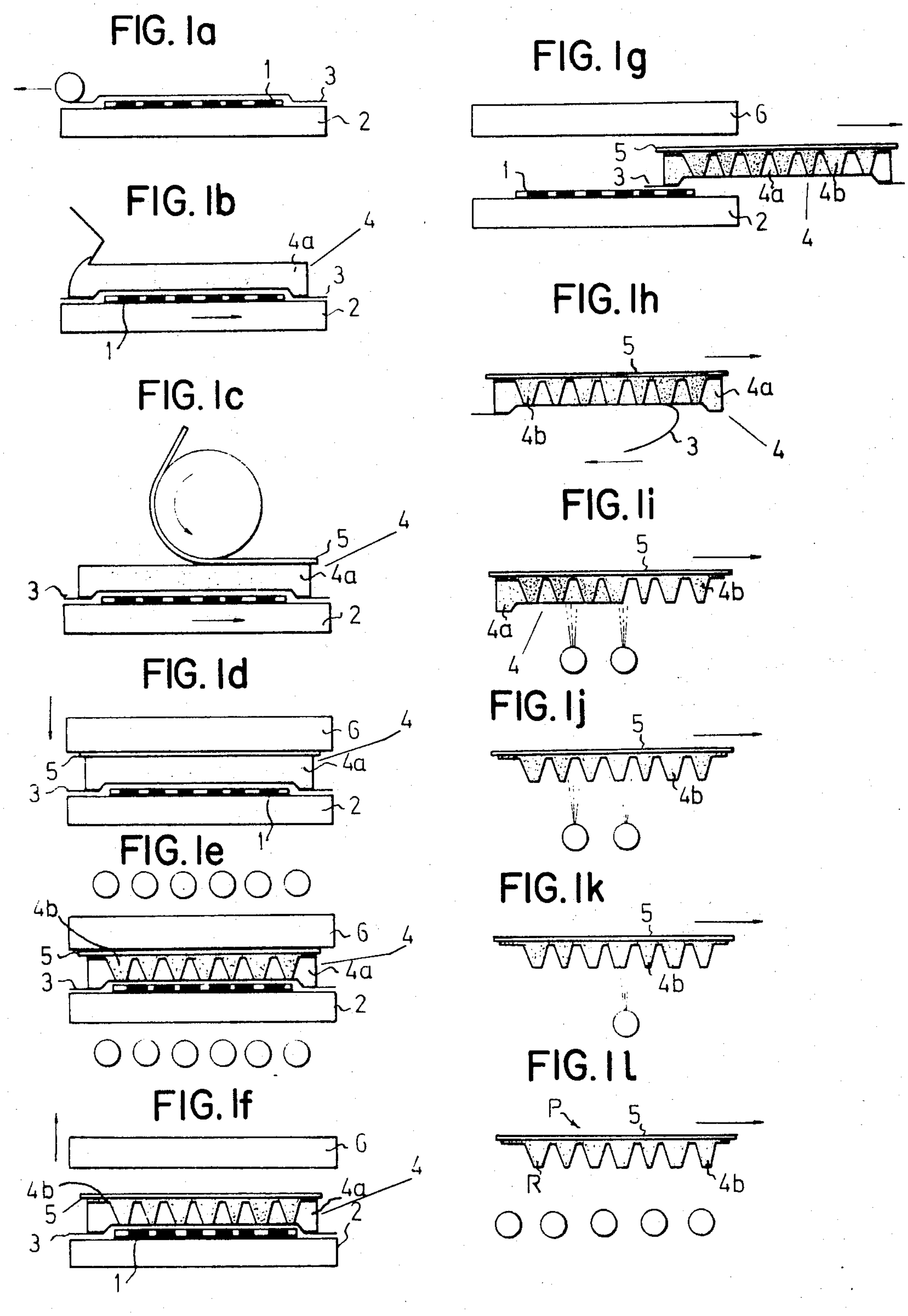
FIG. 1 is a plan view diagrammatically showing the automated process of producing a photopolymer plate having relief image areas in accordance with the present invention.

Referring to the attached drawings, FIG. 1 illustrates an automated process for producing a photopolymer plate having relief image areas which comprises sequential steps (a) to (l) described below;

a. Covering an image-bearing transparency 1 e.g. negative or positive film placed on a rigid support plate 2 capable of transmitting actinic radiation therethrough with a protective film 3 capable of transmitting actinic radiation in intimate contact therewith.

b. Feeding a liquid photosensitive material onto the protective film 3 to form a layer 4 of photosensitive material.

c. Laminating a backing material 5 capable of transmitting actinic radiation onto the layer 4 of photosensitive material, steps (b) and (c) being conducted during transferring the rigid support plate 2 to an exposure station at a controlled speed.

d. Placing a rigid plate 6 capable of transmitting actinic radiation onto the backing material 5.

e. Exposing the layer 4 to actinic radiation, first through the backing material 5 for a controlled period of time, and then backing material 5 for a controlled period of time, and then through the image-bearing transparency 1 for a controlled period of time.

f. Raising the rigid plate 6 from the upper surface of the backing material 5.

g. Pulling out the backing material 5 having the exposed layer 4 of photosensitive material on the lower surface thereof from between the rigid support plate 2 and the rigid plate 6.

h. Removing the protective film 3 from the lower surface of the exposed layer 4, steps (g) and (h) being conducted during transferring the backing material 5 having the exposed layer 4 on the lower surface thereof to a washing-out station at a controlled speed.

i. Washing out non-exposed, unhardened portion 4*a* of the layer 4 with a liquid.

j. Treating the relief image areas of the resulting photopolymer plate R with a surface treating agent.

k. Drying the photopolymer plate, and l. Exposing the dried photopolymer plate to actinic radiation for a controlled period of time, steps (i) to (l) being conducted during transferring the backing material 5 from the washing-out station through a post-exposure station at a controlled speed.

In the above-described automated process, steps (k) and (l) can be carried out simultaneously. Also, step (l) can be carried out prior to step (k). The process may additionally comprise a step of washing the relief image areas of the photopolymer plate with water after step (i), and in this case step (j) can be omitted. Also, the process additionally can comprise a step of removing liquid adhering to the upper surface of the backing material and the surface of the relief image areas by blowing compressed air thereon and, if desired, by pressing the resulting photopolymer plate with a pair of rollers.

In carrying out the process of this invention the preferred range of the speed for transferring the rigid support plate to the exposure station is from about 50 to about 500 mm/sec. and the preferred range of the speed for transferring the backing material having the exposed layer on the lower surface thereof to the washing out station is from about 1 to about 6 m/min. The preferred range of the speed for transferring the backing material 5 having relief image areas on the lower surface from the washing-out station through the post-exposure station is from about 0.5 to about 3.0 m/min. Neither of these ranges are limitative, and are merely given as guide lines to one skilled in the art for a rapid, yet efficient, processing sequence. However, using the speeds above does take into consideration the normally used viscosities of photosensitive materials, generally used sheet material application techniques and enables one to use commercially available elements in the liquid processing sequences of the present invention. For these reasons, operation within the above range would generally be quite suitable for commercial applications.

Examples of suitable protective films include plastics such as polyesters and cellophane films and the thickness of these protective films are preferably in the range of about 6 microns to 50 microns. These examples are merely illustrative, and numerous other materials will be appreciated by one skilled in the art. The main criterial which the protective film must exhibit is that it must lay flat on the original, and must not excessively adhere to the photosensitive layer during step (h) described above, though it must be removable with the assembly during step (g) above. Any protective films similar to polyesters and cellophane films can be used. Preferred films and polyethylene terephthalates.

One type of liquid photosensitive materials which is suitably used herein includes photosensitive compositions fluid at temperature of from about 0°C to about 60°C, as set forth in U.S. Pat. Nos. 3,556,791, 3,628,963 and 3,663,222, and U.S. application Ser. Nos. 201,992 filed Nov. 24, 1971, now pending, and 318,284 filed Dec. 26, 1972, now pending. Such liquid photosensitive compositions comprises (i) unsaturated polyester: (ii) at least one ethylenically unsaturated compound, (iii) a photosensitizer and, if necessary, (iv) a thermal polymerization stabilizer.

Unsaturated polyesters may be produced by the conventional methods. Usually an unsaturated polyester is formed by direct esterification, ester exchange or addition reaction between an alcoholic component comprising at least one polyol and acidic component comprising at least one unsaturated dicarboxylic acid and/or its anhydride and/or dimethyl or diethyl ester thereof, and if desired, a saturated mono-, di-, or poly-carboxylic acid, unsaturated monocarboxylic acid anhydrides or methyl or ethyl esters thereof.

Examplary unsaturated dicarboxylic acids, anhydrides and methyl or ethyl esters thereof utilized for the preparation of an unsaturated polyester include maleic acid, fumaric acid, citraconic acid, mesaconic acid, itaconic acid, glutaconic acid, muconic acid, aconitic acid, dimethyl or diethyl esters thereof, or anhydrides thereof, especially maleic anhydride, citraconic anhydride and itaconic anhydrido.

Examples of suitable saturated dicarboxylic acids, anhydrides and methyl or ethyl esters thereof include oxalic acid, malonic acid, succinic acid, glutaric acid, adipic acid, pimelic acid, suberic acid, azelaic acid, sebacid acid, methyl malonic acid, methyl succinic acid, phthalic acid, isophthalic acid, terephthalic acid, dimethyl or diethyl esters thereof, and phthalic anhydride.

Examples of suitable diols which may be included in the unsaturated polyesters are ethylene glycol, 1, 2-propylene glycol, 1, 3-propanediol, 1, 4-butanediol, diethylene glycol, dipropylene glycol, polyethylene glycols having an average molecular weight of at least about 150, polypropylene glycols having an average molecular weight of at least about 192, polybutylene glycols having an average molecular weight of at least about 162 and copoly (exyethylene exypropylene) glycols having an average molecular weight of at least about 120.

Example of suitable ethylenically unsaturated monomers include actylic acid, methacrylic acid, methyl acrylate, ethylacrylate, n-propyl actylate, isopropyl acrylate, n-hexyl acrylate, n-octyl acrylate, n-dodecyl acrylate, cyclohexyl actylate, tetrahydrofurfuryl acrylate, allyl acrylate, glycidyl acrylate, styrene, vinyltoluene, divinylbenzene, carboxystyrene, diallylphthalate, tryallycyanurate, vinyl acetate, acrylamide, methacrylamide, N-methylolacrylamide, N-methylolmethacrylamide, N-methoxymethylacrylamide, N-methoxymethylmethacrylamide, N-ethoxymethylacrylamide, N-ethoxymethylmethacrylamide, N-n-propoxymethylacrylamide, N-isopropoxymethylmethacrylamide, N-n-butoxymethylacrylamide N-isobutoxymethylmethacrylamide, N,N'-methylenebisacrylamide, N,N'-methylenebismethacrylamide, N,N'-trimethylenebisacrylamide, N,N'-trimethylenebismethacrylamide, N,N'-hexamethylenebisacrylamide, N,N'-hexamethylenebismethacrylamide, 2-hydroxyethyl acrylate, 2-hydroxyethyl methacrylate, 2-hydroxypropyl acrylate, 2-hydroxypropyl methacrylate, 3-chloro-2-hydroxypropyl acrylate, 3-chloro-2-hydroxypropyl methacrylate, 4-hydroxybutyl acrylate, 4-hydroxybutyl mothacrylate, diethyleneglycol monoactylate, diethyleneglycol monomethacrylate, dipropyleneglycol monoacrylate, dipropyleneglycol monomethacrylate, polyethyleneglycol (average molecular weight: about 150 to 200) monoacrylate, polyethyleneglycol (average molecular weight: about 150 to 200)monoethacrylate, polypropyleneglycol (average molecular weight: about 150 to 200) monoacrylate and polypropyleneglycol (average molecular weight: about 150 to 200) monomethacrylate, ethyleneglycol di-acrylate or -methacrylate, diethyleneglycol di-acrylate or -methacrylate, triethyleneglycol di-acrylate or -methacrylate, tetraethyleneglycol di-acrylate or methacrylate, polyethyleneglycol (average molecular weight: 200 to 1,000) di-acrylate or -methacrylate, propyleneglycol di-acrylate or -methacrylate, dipropyleneglycol di-acrylate or -methacrylate, polypropyleneglycol (average molecular weight: 100 to 1,000) di-acrylate or -methacrylate, butyleneglycol di-acrylate or -methacrylate, trimethylolethane tri-acrylate or -methacrylate, trimethylolpropane tri-acrylate or -methacrylate and pentaerythritol tetraacrylate or -methacrylate, acrylamides include N-3-oxopropyl acrylamide, N-3-oxobutyl acrylamide, N-3-oxo-1-methyl-butyl acrylamide, N-3-oxo-1-1 methyl-1, 3-diethyl-propyl acrylamide, N-3-oxo-1, 1-dimethylbutyl acrylamide, N-3-oxo-methyl-1, 3-dicyclohexyl-propyl acrylamide, N-3-oxo-1,5-dimethyl-1-isopropyl-hexyl acrylamide, N-3-oxo-1,1-diisobutyl-2-isopropyl-5-methyl-hexyl acrylamide, N-3-oxo-1,1-dibutyl-2-n-propyl-heptyl acrylamide, N-3-oxo-1-methyl-butyl alphamethyl acrylamide, and N-3-oxo-1,1-dimethylbutyl alpha-methyl acrylamide, and the like.

These ethylenically unsaturated monomers are typically used in an amount of from about 10 to about 200 parts by weight based upon 100 parts by weight of the unsaturated polyester.

Examplary photopolymerization initiators include benzoins such as benzoin, benzoin methyl ether, benzoin ethyl ether, benzoin n-propyl ether, benzoin isopropyl ether, benzoin n-butyl ether, benzoin isobutyl ether benzoin secbutyl ether, alpha-methylbenzoin, alpha-ethylbenzoin, alpha-methylbenzoin methyl ether, alpha-phenylbenzoin, alpha-allylbenzoin; anthraquinones such as anthraquinone, chloroanthraquinone, methylanthraquinone, ethylanthraquinone, tertiary butylanthraquinone; diketones such as benzil, diacetyl; phenones such as acetophenone, benzophenone, omegabromoacetophenone; 2-naphthalene sulfonyl chloride; disulfides such as diphenyl disulfide, tetraethylthiouram disulfide; dyes such as Eosine G (C.I. 45380) and Thionine (C.I. 52025); and the like. These photopolymerization initiators are typically used in an amount of from about 0.001 to about 10 parts by weight based upon 100 parts by weight of the photosensitive composition.

Examplary thermal polymerization stabilizers include hydroquinone, monotertbutyl hydroquinone, 2,5-di-tert-butyl hydroquinone, catechol, tert-butyl catechol, benzoquinone, 2,5-diphenyl-p-benzoquinone, p-methoxy phenol, picric acid and cuprous chloride.

These stabilizers are added only for preventing thermal polymerization without the actinic radiation set forth above without restraining the photopolymerization reaction. Consequently, the amount of the stabilizers may be generally about 0.001 to about 2.0 parts by weight based upon 100 parts by weight of the photosensitive composition.

Another type of liquid photosensitive material useful to form printing plates in liquid photosensitive compositions is set forth in Japanese Patent Publication No. 29525/1971, which comprises (i) a polyene containing at least two unsaturated carbon to carbon bonds per molecular; (ii) a polythiol containing two or more thiol groups per molecular; and (iii) a photosensitizer.

In the context of the present invention, the exact liquid photosensitive material is not overly critical. The material, of course, must be image-wise hardenable during the exposure step and must be amendable to the final processing sequences described in steps (i) – (l) above. So long as these criteria are met, the liquid photosensitive material may be freely selected.

The liquid photosensitive compositions may contain additives such as viscosity modifiers, thickeners, plasticizers, fillers, dyes, and the like, in an amount, such as to not render the photosensitive compositions opaque.

All of these materials are well known in the art, and can be used in their art recognized amounts so long as they, as indicated, do not render the photosensitive compositions opaque, Other limitations are basically commonsense limitations, i.e., such large proportions should not be used as to adversely affect the composition or its processing capability.

The referred thickness of the layer of photosensitive material is from about 0.10 to about 5.00 mm. This is merely a guide line, but generally such thicknesses permit excellent photopolymer plates to be manufactured.

Examples of suitable backing materials include plastics such as polyesters, polyamides, polyvinyl chloride, polyvinylidene chloride, polymethylmethacrylate, polystyrene and cellulose ester films and sheets. The thickness of these backing materials is preferably in the range of about 50 microns to about 2 mm. Any similar materials can be used, as the backing material primarily serves a supporting function in the present invention. Accordingly, one will consider the end use of the polymer plates in selecting a backing material. Thicknesses as described above enable good exposure to be carried out, and yet provide sufficient strength to the assembly. They are not, of course, limitative.

An adhesive anchor layer may be provided on such backing materials 5, if desired. The adhesive anchor layer is composed of a synthetic resin or polymer such as alkyl resins, urethane resins, epoxy resins, melamine resins and synthetic rubbers. The thickness of the adhesive anchor layer is preferably in the range of 0.1 micron to 0.3 mm. The adhesive anchor layer may contain a photopolymerization initiator as described in German DOS Patent No. 2,031,476.

The exact adhesive material selected is not overly critical, and so long as a good adhesive effect between the backing material and the photosensitive material layer is provided, any photographically compatible adhesive should not be opaque, will be apparent to one skilled in the art.

The liquids which are employed for developing the relief image of the photopolymer plate made from the liquid photosensitive material depend on the liquid photosensitive material employed and include, for example, water; aqueous alkaline solutions such as aqueous solutions of sodium hydroxide, potassium hydroxide, calcium hydroxide, ammonium hydroxide, sodium phosphate, sodium tripolyphosphate, sodium borates including borax, sodium silicate, sodium carbonate, sodium bicarbonate, potassium carbonate; aqueous acidic solutions such as aqueous acidic solutions of hydrochloric acid, sulfuric acid, nitric acid and acetic acid; aqueous solutions of methanol, ethanol, isopropanol and acetone; organic solvents such as methanol, ethanol, isopropanol, acetone, methylethyl ketone, ethyl acetate, butyl acetate, dioxane, tetrahydrofuran, phenol, ether, benzene, toluene, gasoline, kerosene, light oil, trichloroethylene and mixtures thereof. The above-described aqueous alkaline solutions may contain a surface active agent, if desired.

As will be appreciated by one skilled in the art, these materials essentially serve as solvents for the imagewise exposed photosensitive material, removing non-exposed, and hence unhardened portions of the layer. Accordingly, any material which exhibits such a solvent function without harmful effects on the photosensitive material can be used. The above listing does, however, include those materials which will be most useful on a commercial basis, considering cost and effectiveness.

The non-exposed, unhardened portions *4a* may be removed by spraying the liquid preferably maintained at a temperature of from about 10°C to about 60°C at a preferred pressure of from about 0.5 to about 3.5 $Kg/cm^2$.

These values merely serve as guide lines, and higher and lower temperatures and pressures can be used, if desired. The main criteria of the conditions used is that the non-exposed unhardened portions 4a be cleanly removed without harm to the exposed hardened portions.

The pressure of application may be freely selected, so long as neither the compressed air nor the rollers harm the exposed, hardened portions *4b*.

After removal of the non-exposed, unhardened portions, it is preferred to blow compressed air to the upper surface of the backing material and the relief image areas at a rate of from about 5 to 40 $m^3$/min. and if desired, to press the resulting photopolymer plate with a pair of rollers. By treating a photopolymer plate with a surface treating agent relief image areas of a photopolymer plate can be completely hardened to the surface and also the period of post-exposure for completely hardening the relief image areas is remarkably shortened.

Suitable examples of the surface treating agents which are employed herein include those disclosed in U.S. application Ser. No. 318,284 filed Dec. 26, 1972, now pending, which are aqueous solutions or emulsions containing at least one membrane-forming polymeric compound or wax or together with at least one reducing agent.

Examples of suitable membrane-forming polymeric compounds and waxes which may be used in the preparation of aqueous solutions or emulsions include sodium alginato, gum arabic, casein, water soluble cellulose compounds such as carboxymethyl cellulose, methyl cellulose, ethyl cellulose, hydroxyethyl cellulose; starch and starch compounds such as sodium starch glycolate; water-soluble polymeric compounds such as polyvinyl alcohol and its partial esters, others and acetals, polyvinyl pyrrolidone, polyacrylic acid, sodium polyacrylate, polyacrylamide, polymers of ethylene oxide having an average molecular weight of about 10,000 to 2,000,000, methyl vinyl/maleic anhydride copolymers; mineral waxes such as paraffin wax; botanical waxes such as carnauba, Japan wax, animal waxes; natural waxes such as boos wax; synthetic waxes, liquid paraffin; polystyrene and its copolymers, polyvinylidene chloride and its copolymers; polyvinylidene chloride and its copolymers, polyvinyl acetate and its copolymers and polyacrylates and their copolymers.

The concentration of the membrane-forming polymeric compound or wax is adjusted to such an extent that the thickness of the coated membrane on the photopolymer plate is about 0.01 microns to about 50 microns, preferably 0.1 microns to 20 microns. When the thickness is lower than 0.01 microns, the desired effects are hardly realized. On the other hand, as the thickness increases higher than about 50 microns very narrow or small non-relief image portions are filled with the polymeric compound or wax and the thickness of the membrane coated becomes uneven. Consequently the precision of thickness of the resulting photopolymer plate is lost and the quality of prints is lowered.

In order to produce such thickness the concentration of the membrane-forming polymeric compound or wax is in the range of from about 0.05 to 60 percent by weight with the preferred range being 0.1 to 20 percent by weight.

Examples of suitable reducing agents which may be used in order to shorten the time of post-exposure include:

(1) thiourea compounds of the general formula:

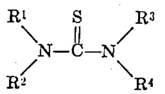

wherein $R^1$, $R^2$, $R^3$ and $R^4$, each represent a hydrogen atom, an allyl group, amino group, acetyl group, phenyl group or alkyl group having at most 10 carbon atoms, and exemplary thiourea compounds including thiourea, allyl thiourea, N,N-diallyl thiourea, N,N'-diallyl thiourea, triallyl thiourea, tetraallyl thiourea, methyl thiourea, ethyl thiourea, n-propyl thiourea, isopropyl thiourea, n-butyl thiourea, N,N-diethyl thiourea, N,N'-allylmethyl thiourea, N,N'-diallylmethyl thiourea, N,N'-methyl ethyl thiourea, N,N'-dimethylethyl thiourea, N,N'-dimethyl-allyl thiourea, phenyl thiourea, N,N'-diphenyl thiourea, N,N'phenylmethyl thiourea, N,N'-diphenylmethyl thiourea, acethyl thiourea, N,N-diacetylthiourea, N,N'-diacetyl thiourea, N,N'-acetyl ethyl thiourea, N,N'-diacetyl methyl thiourea, N,N'-acetylallyl thiourea and thiosemicarbazide, (2) monosacharides and disacharides including glycose, mannose, galactose, lactose and maltose, (3) ascorbic acid, (4) ethylenediamine tetraacetic acid and the alkali metal salts including ethylenediamino tetraacetic acid sodium salt and potassium salt, (5) oxalic acid and the alkali metal salts including sodium oxalate, potassium oxalate and potassium hydrogenoxalate, (6) thiosulfate salts including sodium thiosulfate, potassium thiosulfate, calcium thiosulfate and ammonium thiosulfate, (7) thiocyanate salts including sodium thiocyanate, potassium thiocyanate, calcium thiocyanate and ammonium thiocyanate, (8) stannous salts including stannous chloride, stannous bromide, stannous sulfate and stannous oxalate, and (9) ferrous salts including ferrous chloride, ferrous bromide, ferrous sulfate, ferrous ammonium sulfate and ferrous acetate.

The concentration of the reducing agent is in the range of from about 0.001 percent by weight to a saturation, with preferred range being from 0.01 percent by weight to 30 percent by weight. As the concentration decreases below 0.001 percent by weight, the desired effects are hardly realized.

In preparing the aqueous emulsions any conventional emulsifier may be employed. Examples of suitable emulsifiers include nonionic, anionic and cationic surface active agents such as polyoxyethylene nonylphenyl ether, polyoxyethylene alkyl ether, sorbitan fatty acid esters, sodium alkyl sulfates and sulfonates of 12 to 18 carbon atoms, alkyl amino carboxylates and dicarboxylates.

The concentration of the emulsifier is typically in the range of from about 0.01 to 20 percent by weight.

Furthermore, in order to improve the stability of the aqueous emulsions there may be employed coloidal silica, polyethylenes of an average molecular weight of from about 500 to about 5000, resin, urea, fatty acids, organic solvents and ammonia in the preparation of the aqueous emulsions.

The surface treating agent preferably maintained at a temperature of from about 10°C to about 50°C may be sprayed onto the relief image areas of the photopolymer plate at a preferred pressure of from about 0.1 to about 2.0 $Kg/cm^2$.

Neither the surface treating agents or the temperatures and pressures defined above are limitative. It will be clear that the surface treating agent selected will depend upon the photosensitive material used. So long as the hardening effect is obtained, the materials used may be freely selected.

Instead of such a surface treating agent, water may also be employed.

The photopolymer plate treated with (i) water, (ii) water and subsequently a treating agent or (iii) a treating agent after removal of the non-exposed, unhardened portions, is dried by blowing hot air of a preferred temperature of from about 30°C to about 90°C thereon at a preferred rate of from about 1 to about 20 $m^3/min$.

Since merely a drying step is performed, neither the temperatures nor pressures are limitative so long as, of course, drying is completed in a reasonable amount of time and the hardened areas are not injured by excessively high temperatures of excessively high pressures. A commonsense approach can be used by those skilled in the art.

The dried photopolymer plate is then post-exposed to actinic radiation.

The exposure and the post-exposure are effected by actinic radiation of a wave length of from about 2,000 to about 8,000 Angstroms. Practical sources of such actinic radiation include carbon arc lamps, super high pressure mercury lamps, high pressure mercury lamps, low pressure mercury lamps, xenon lamps and ultra violet fluorescent lamps.

The period of exposure of the photosensitive material to actinic radiation may vary within wide limits depending upon such factors as the photosensitive material employed, the thickness of the layer of photosensitive material, the actinic light source selected and the distance from an actinic light source chosen. Typically the exposure period is from about 1 second to about 30 minutes. However, from the point of view of minimizing the production period of a photopolymer plate, shorter exposure periods are preferred. According to the present invention the preferred period of exposure of the photosensitive material to actinic radiation through the backing material is from 2 to 30 seconds and that through the image-bearing transparency is from 15 to 90 seconds.

The period of post-exposure of the photopolymer plate to actinic radiation is sufficient to more completely harden or detachify the exposed, hardened areas of photopolymer plate. The preferred period of post-exposure of the photopolymer plate is from about 10 to about 60 seconds.

Figure 2:
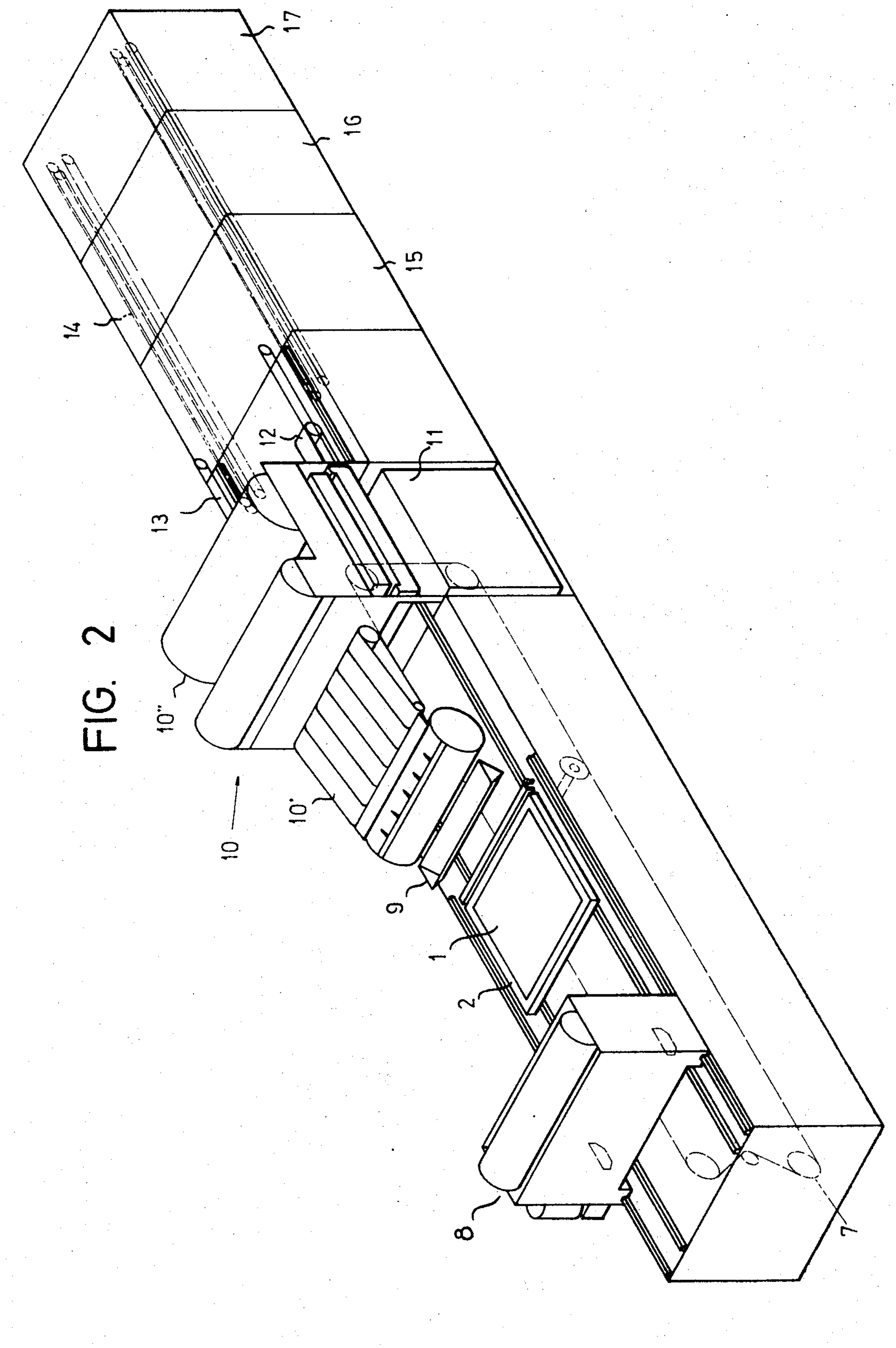
FIG. 2 is a side perspective view generally illustrating the apparatus of the present invention.
Figure 3:
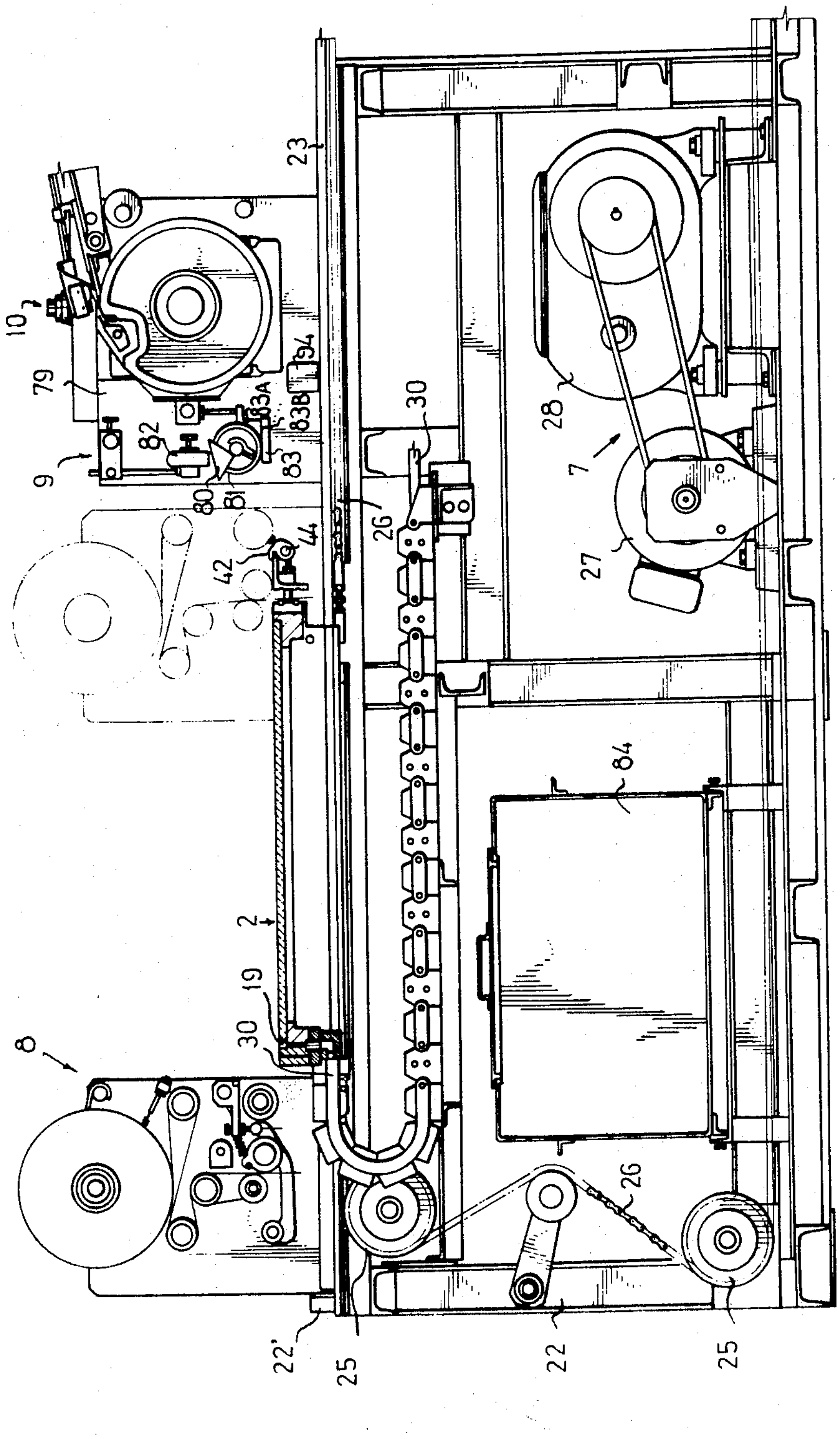
FIG. 3 is a side view of the apparatus from a protective film feeding portion to a backing material feeding portion.

Referring to FIGS. 2 and 3, there is shown automated apparatus for producing a photopolymer plate (P), the apparatus comprising a transfer means 7, a protective film feeding means 8, a liquid photosensitive material feeding means 9, a backing material feeding means 10 with a transfer means 10′ and a feeding means 10″, an exposure means 11, a protective film removing means 12, a transfer means 13, a transfer means 14, a washing-out means 15, a surface treating means 16, a post-exposure means. 17.

These elements or means will be generally discussed in the order recited. Prior to each detailed discussion an overview of the elements or means will be provided. For a full understanding of the means, of course, the detailed discussion following each overview should be referred to, since the overviews do not necessarily identify every single element, merely the most important elements generally for a between understanding of the detailed discussion.

OVERVIEW OF TRANSFER MEANS 7 AND RIGID SUPPORT PLATE 2

FIG. 3 shows the general relationship between the rigid support plate 2 and the transfer means 7, with the protective film feeding means 8 and photosensitive material feeding means 9 and the end of the backing material feeding means 10′ generally shown therein, all carried on a frame 22.

Figure 4:
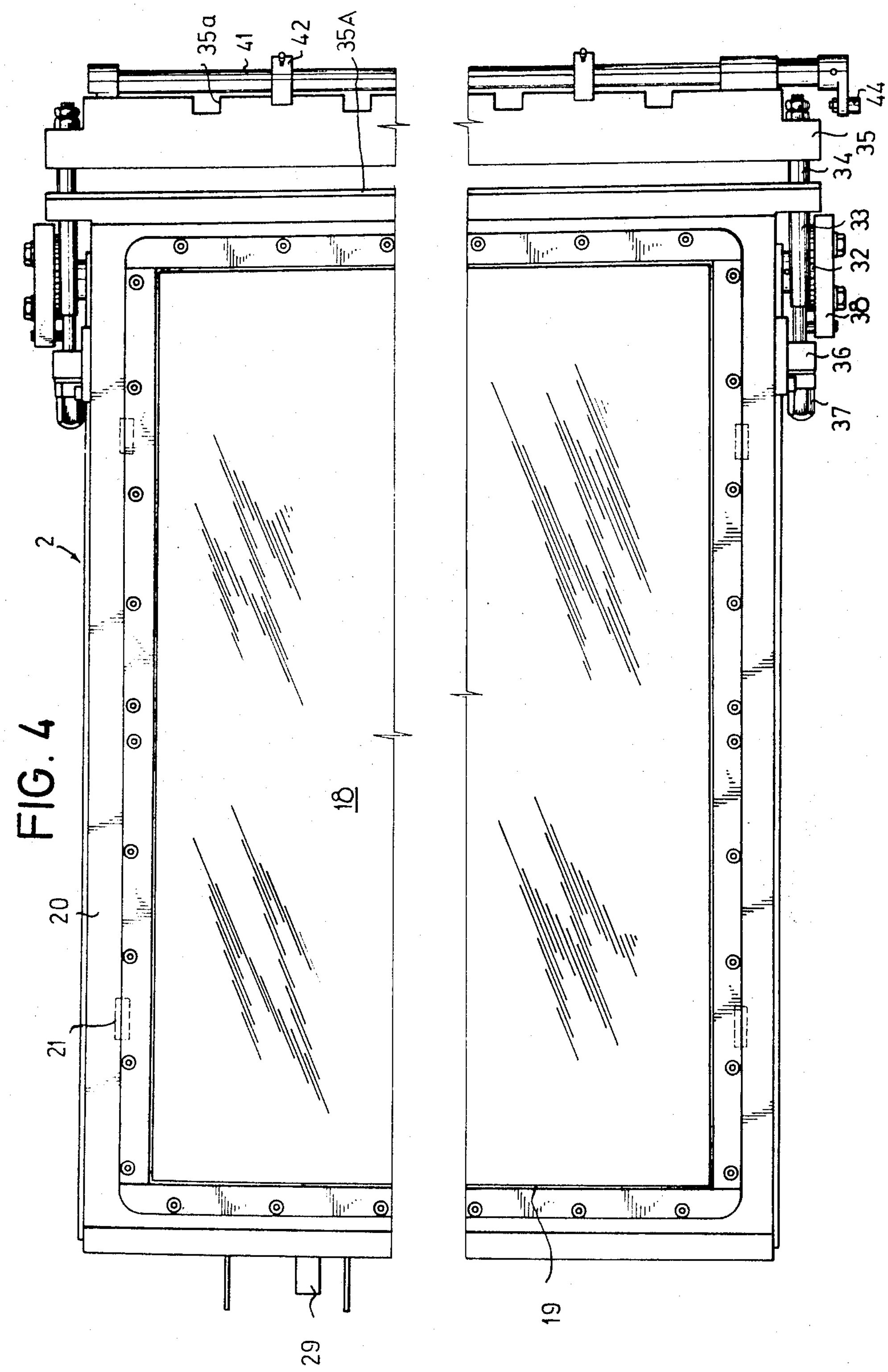
FIGS. 4 to 6 are top, front and left side views, partially fragmented, of a rigid support plate, respectively.
Figure 5:
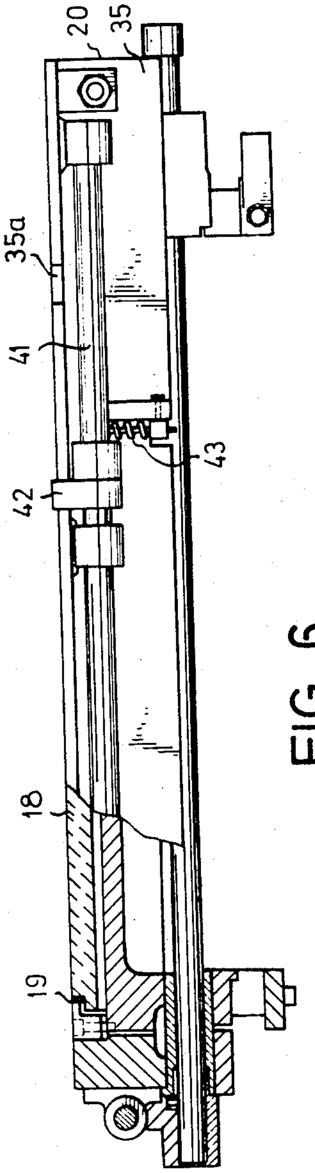
Figure 6:
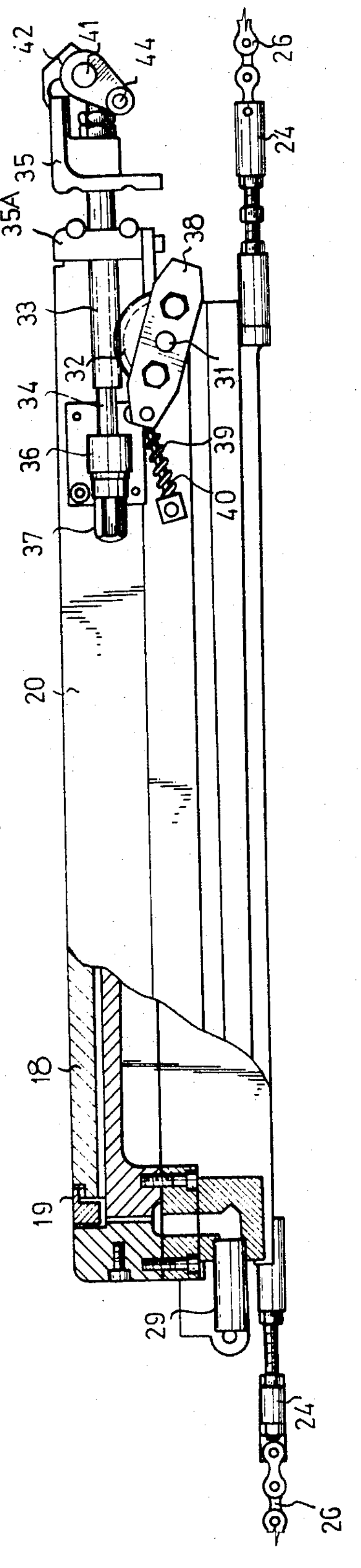

The transfer means essentially comprises a motor gearing arrangement 27/28 which reciprocates the rigid support plate 2 in horizontal rails 23 on frame 22 from procession stations (e.g., 8, 9, 10, etc.). The rigid support plate 2 is connected to air pressure-vacuum means 30 via hose 29 to apply pressure or pull a vacuum via a groove 19. As best shown in FIGS. 4 to 6, the forward edge of the rigid support plate 2 has a clamp between 35-A to hold a protective film 3 and a gripper 42 to hold a backing material 5, the clamp and gripper both co-acting via cams with other elements of the apparatus to be opened and closed at the necessary process times to appropriately receive and hold and later release the protective material 3 and the backing material 5.

DETAILED DESCRIPTION OF TRANSFER MEANS 7 AND RIGID SUPPORT PLATE 2

Referring initially to FIGS. 4 to 7, a rigid support plate 2 has on its upper surface a glass sheet 18 fitted in a slitlike groove 19 provided in the circumference of the frame 20 of the rigid support plate. The rigid support plate 2 and the rigid plate 18 are typically glass sheets or plates and it is preferred to employ ground glass sheets or plate from the point of view of forming relief images having a cross section of isosceles trapezoid. The rigid support plate 2 is adapted to be moved by rollers 21 journaled in both lateral lower portions of the frame 20. With reference to FIG. 3, the transfer means 7 serves to move the rigid support plate 2 along a pair of guide rails 23 disposed on the frame 22 of the apparatus of this invention so as to facilitate the linear reciprocating travel of the rigid support plate 2 from what can be termed the rearward side of the apparatus toward means 8 to the forward side of the apparatus towards means 9, and vice versa.

The reciprocating travel of the rigid support plate 2 is effected by connecting the end of a chain 26, through sprocket wheels 25 provided within the frame 22, to the opposite ends of frame 20 of the rigid support plate 2. Coupling portions 24 are attached to the lower ends of the forward and rear portion of the rigid support plate 2 (see FIG. 7), and the rigid support plate 2 travels in the direction required to produce relief plate (P).

As shown in FIG. 3, the rigid support plate (P) is moved by a chain 26 driven by a motor 27 and a gearing unit 28 provided at the base of the frame 22. An air inlet pipe 29 communicates with the rear end of the rigid support plate 2 and with the groove 19 in the rigid support plate 2. The air inlet pipe 29 is connected to a flexible air hose 30 which follows the movement of the rigid support plate 2. The air hose 30 is connected to and air cylinder not shown adapted to feed compressed air thereto or pull a vacuum thereon. The central area between the pair of guide rails 23 is open to permit the chain 26 and the air hose 30 to pass there through.

Referring now to FIGS. 4 to 7, shaft 31 is transversely journaled to the lower end of forward portion of the frame 20 of the rigid support plate 2, the shaft 31 being equipped with sector wheels 32 rigidly attached to both ends thereof. Members 33 are respectively attached to rods 34 journaled to the lateral portion of the frame 20 of rigid support plate 2 in a manner so as to be reciprocate in the forward and rearward directions the members 33 having racks which interlock with respective sector wheels 32. Rigidly attached to the forward ends of the member 33 is a movable plate 35 with an inverted L-shaped cross section (see FIG. 6). The movable plate 35 constitutes a reciprocable clamp in cooperation with the forward end of frame 20 shown as 35A in FIG. 6, and the opening distance of the clamp can be controlled by operating rod length adjusting nuts 37 abutting bearing 36 which serve as a stopper. Attached to the outer lateral faces of sector wheels 32 are cam followers 38 adapted to be forwardly biased and to be inclined downwardly when the movable plate 35 is in the open position, i.e., spaced from the front edge of frame 20. A compression spring 39 is interconnected between the rear end of cam follower 38 and the lateral portion of frame 20 so as to close the clamp when cam follower 38 is rotated to a substantially horizontal position. Numeral 40 is a compression spring guide pin having one end journaled to a rear lateral face of cam follower 38 and having the other and journaled to the lateral portion of the frame 20.

Figure 7:
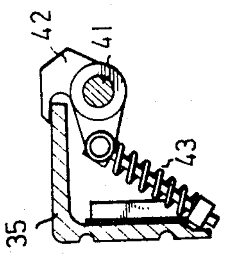
FIG. 7 is a side view partly enlarged in section of the gripper provided at the forward edge of the rigid support plate.

As shown in FIGS. 4–7, a shaft 41 is journaled at both ends thereof to the forward and of the movable plate 35, and the shaft 41 has grippers 42 mounted thereon at a predetermined position. As best shown in FIGS. 5 and 7, portion of the axially connected portion of each grippers 42 and the lower end of movable plate 35, a compression spring 43 is interconnected which normally maintains the grippers 42 in the closed state. Numeral 44 is a cam follower fitting downward and rearward from one end of the shaft 41. Numeral 35a is a cut-out portion provided at a forward edge of movable plate 35 and between respective grippers 42.

OVERVIEW OF PROTECTIVE FILM FEEDING MEANS 8

Protective material feeding means 8 can be considered as comprising, as essential elements, a drive section, a protective material feeding section, a protection material tensioning section and a cutter section. Optional elements are, e.g., a static discharge means, a final pression (smoothing) roller and the like.

In the protective material feeding means 8, drive elements 46 to 53 (exclusive) of frame 47) can be considered the drive section to reciprocate the means 8 along guide rails 23 from its "Start" position to avail a further cycling of the rigid support plate 2.

The non-exposed, unhardened portions may be removed by spraying the liquid preferably maintained at a temperature of from about 10°C to about 60°C at a preferred pressure of from about 0.5 to about 3.5 Kg./cm.$^2$.

These values merely serve as guide lines, and higher and lower temperatures and pressures can be used, if desired. The main criteria of the conditions used is that the non-exposed unhardened portions be cleanly removed without harm to the exposed hardened portions.

The pressure of application may be freely selected, so long as neither the compressed air nor the rollers harm the exposed, hardened portions.

After removal of the non-exposed, unhardened portions, it is preferred to blow compressed air to the upper surface of the backing material and the relief image areas at a rate of from about 5 to 40 m$^3$/min. and if desired, to press the resulting photopolymer plate with a pair of rollers. By treating a photopolymer plate with a surface treating agent relief image areas of a photopolymer plate can be completely hardened to the surface and also the period of post-exposure for completely hardening the relief image areas is remarkably shortened.

Suitable examples of the surface treating agents which are employed herein include those disclosed in U.S. application Ser. No. 318,284 filed Dec. 26, 1972, now pending, which are aqueous solutions or emulsions containing at least one membrane-forming polymeric compound or wax or together with at least one reducing agent.

The protective material feeding section can be viewed as comprising drum 55 in combination with rollers 71, 72, 62 and 66/67, keeping in mind that the protective sheet material is actually unwound from drum 55 by the rearward motion of protective film feeding means 8 after protective film 3 is blown into the clamps area between 35 and 35A by air from nozzle 78 and the clamp closes when the opening force of cam 38' (on frame 47) against cam follower 38 (on rigid support plate 2) is removed.

The protective sheet material tensioning means can be viewed as the combination of elements necessary to transmit the camming action of cam 70' (on frame 22) upon cam follower 70 (on arm 69) to the rollers 66/67 with protective film 3 therebetween when the protective film feeding means 8 abuts cam 70, resulting in a rearward movement of rollers 66 and 67 by the mechanical linkage later explained.

Element 74 is a cutter to cut the protective film 3.

DETAILED DESCRIPTION OF PROTECTIVE FILM FEEDING MEANS 8

Figure 8:
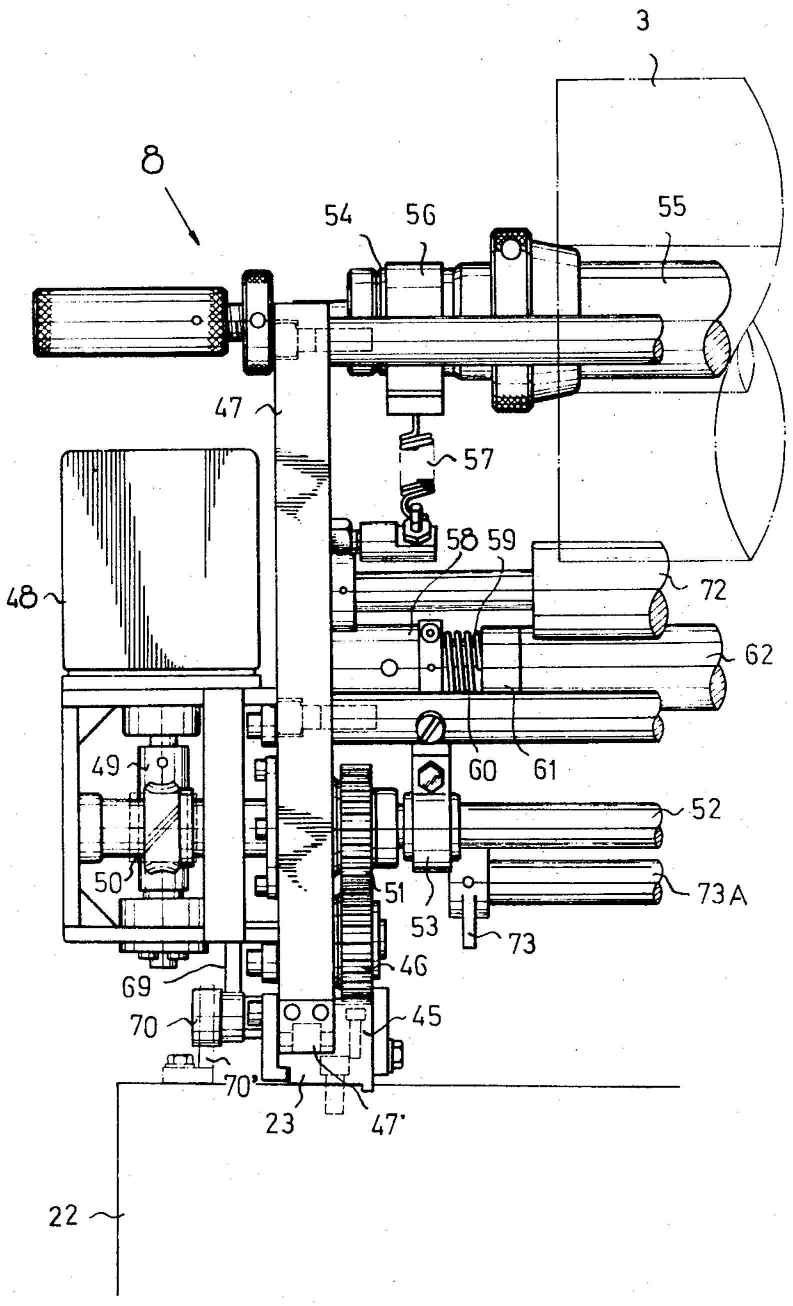
FIGS. 8 to 10 are front, right side and left side views of an essential part of protective film feeding means, as seen in the advancing direction of the means, respectively.
Figure 9:
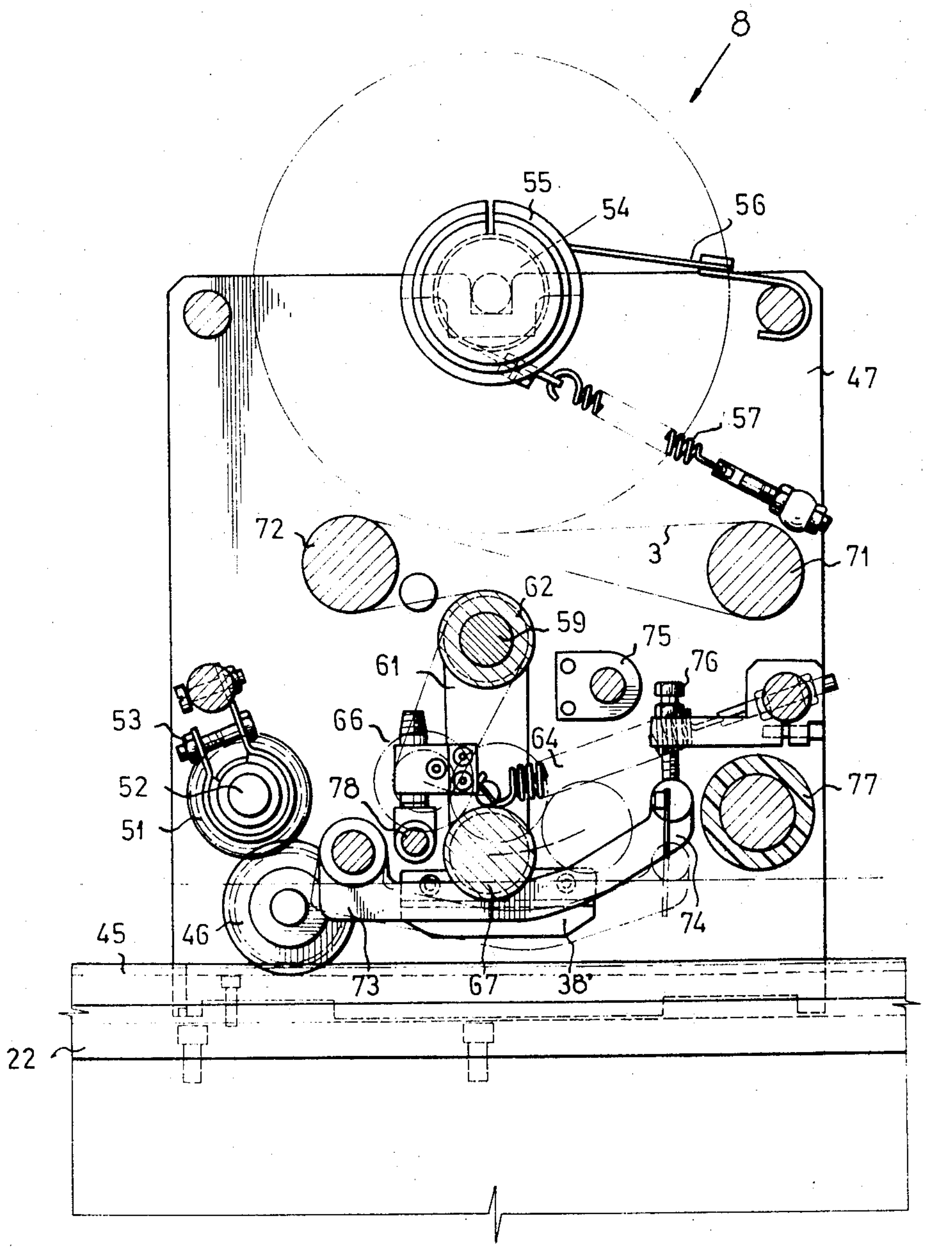

FIGS. 3 and 8 to 10 show a protective film feeding means assembly. The protective film feeding means 8 is provided on the rear portion of the frame 22, and a pair of racks 45 are provided on the frame 22 along the guide rails 23. Pinions 46 gearing into the racks 45 are journaled onto opposite faces of the frame 47 of the protective film feeding means 8 and the frame 47 being supported by rollers 47' journaled in both lower portion thereof in a manner such as to allow reciprocating movement of the frame 47 along rails 23. Attached to the lateral outer face of the frame 47 is a vertically oriented motor 48, and a worm 49 is securely attached to output shaft of the motor 48 journaled to the frame 47. A worn wheel 50 gearing into the worm 49 is fixedly mounted on the outward extending portion of a shaft 52 between opposite faces of the frame 47, and on both ends of the shaft 52 are mounted spur gears 51 in gearing relation with the pinions 46, respectively, to drive the pinions 46. A bracket 53 supports the shaft 52 at an intermediate portion thereof. A drum 55 having a brake wheel 54 is journaled to the upper portion of the frame 47. The protective film 3 is shown wound therearound in the counter-clockwise direction as shown in FIG. 9.

The drum 55 is controlled by a band brake 56 trained around the brake wheel 54 which serves to impart a predetermined tension to the protective film 3 while it is being transferred. A tension spring 57 is disposed on the low tension side of the bank brake 56. Drum 55 is controlled by the brake to be applied tension to the protective film 3 the forward edge of which is hold between the clamp formed by 35 and 35A during returning of the means 8, as later explained.

Figure 10:
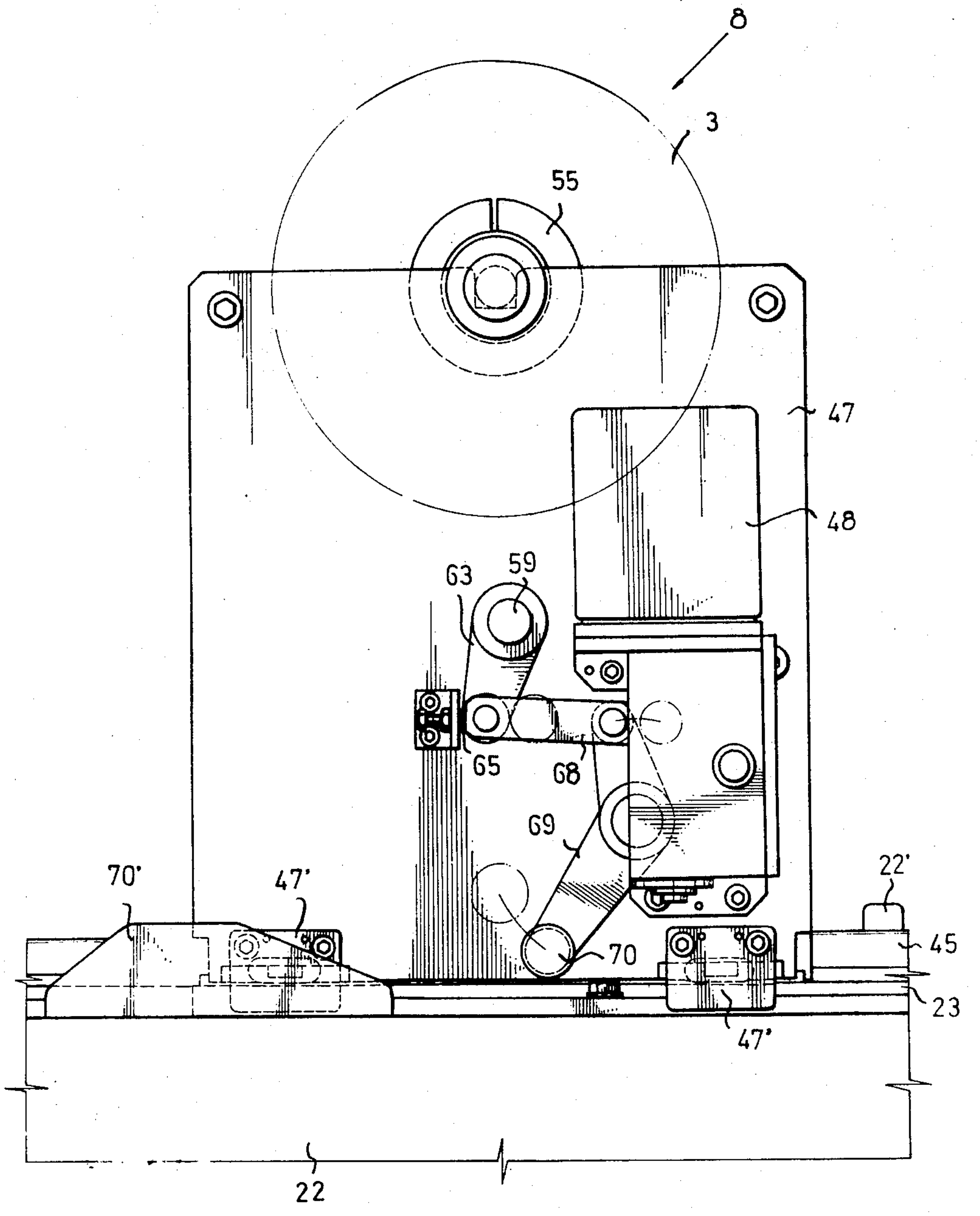

A pair of cylindrical bearings 58 are attached bearings 58 which is rotatably mounted on both ends of a shaft 59 coaxially therewith, the shaft 59 extending through both sides of the frame 47. A pair of arms 61 are fastened at their upper portions to the shaft 59, and arms 61 have a torsion spring 60 interposed between each arm 61 and the bearing 60, and the shaft 59 has a roller 62 journaled thereto. Arms 63 are fastened at their upper ends to each end of the shaft 59 with the arms 61, and the arms 63 are given a rotational force in the clockwise direction (as shown in FIG. 10) by tension springs 64 interposed between the arms 61 and the forward portion of the frame 47. Numeral 65 is a stopper on frame 47, adapted to regulate the rotation of the arms 63. A roller 66 is rotatably mounted on an intermediate portion of the arms 61, and a roller 67 is rotatably mounted on the lower ends of the arms 61 at a predetermined distance from the roller 66.

As best shown in FIG. 10, the actuating means of the arms 63 comprises a lever 69 with a cam follower 70 in combination with a cam 70' disposed on the frame 22. The lever 69, connected with the lower end of the arm 63 by a connecting rod 68, is journaled to the lateral outer face of the frame 47 and the cam follower 70 is mounted on the lower end of the lever 69 in such a manner as to rotate the lever 69 following the action of a cam 70; thereby rotating the lever 69 in the clockwise direction as shown in FIG. 10, which rotation is transmitted to rollers 66 and 67 with the protective film 3 held therebetween in the rearward and upward direction as shown in FIG. 9 to apply tension to the protective film 3 as it is held between the clamp formed by 35 and 35A, as later explained.

Rollers 71 and 72 are rotatably mounted on the frame 47 between the drum 55 and the roller 62. Thus, the protective film 3 is transferred from the drum 55 by way of the rollers 71, 72, roller 62, and through the contact point of rollers 66 and 67 to extent its leading end downward.

As shown in FIG. 8, a pair of arms 73 which are energized to move upward by electro-magnet (not shown) are journaled on a shaft 73A provided between the confronting faces of the frame 47 at the lower portion thereof (see FIG. 8). The arms 73 are provided with a cutter 74 as shown in FIG. 9 for cutting the protective film 3, the cutter 74 being adapted to be lowered by the action of the electromagnet (not shown).

As shown in FIG. 9, numeral 75 is a static electricity eliminator, numeral 76 is a bolt mounted to frame 47 for the prevention of bouncing of the cutter 74, numeral 77 is a press roller disposed between opposite faces of the forward portion of the frame 47 spaced to impart a downward pressing force on the upper surface of the rigid support plate 2 during the return of the means 8, and numeral 78 is a nozzle means having a nozzle disposed to the rear of the roller 67. The nozzle means is adapted to eject compressed air from a compressor (not shown) included in the frame 22 after the termination of transfer movement of the frame 47. The protective film feeding means 8 is arranged so as to be reciprocatable as a whole on the rigid support plate 2 via motor 48.

OVERVIEW OF RELATIONSHIP BETWEEN RIGID SUPPORT PLATE 2 AND PROTECTIVE SHEET MATERIAL FEEDING MEANS 8

The relationship of the protective material feeding means 8 and the rigid support plate 2 can be described as follows.

The protective film feeding means 8 at the rest position "loosely" holds material 3 between rollers 66 and 67 because of the forward biasing action of spring 64, and this "loose" condition is maintained when the motor 48 is activated to drive pinions 46 along rail 45 via elements 49-50-51 and 52 and bring means 8 into position over the rigid support plate 2.

Before the means 8 reaches rigid support plate 2 having the image-bearing transparency 1 thereon, the cam follower 70 on means 8 abuts cam 70′ on the frame 22, thereby moving arm 69 back and upward. This motion is transmitted as a downward tensioning motion to rollers 66 and 67 via elements 68, 63, 58/59, 60 and 61 during the continuing return of means 8. The protective film 3, now positioned above the clamp formed by 35 and the forward edge 35A of the rigid plate maintained half open by cam 38′ now positioned above the clamp formed by 35 and the forward edge 35A of the rigid plate maintained half open by cam 38′ on the frame 47 forcing cam follower 38 on the rigid support plate 2 upwardly and forward, is subjected to a blast of compressed air from nozzle 78 on the frame 47 and falls into the clamp space between 35 and 35A. The motion of the spring 39 is converted into the closing motion at the clamp 35 from the opening motion at the clamp 35, when cam followers 38 are rotated to the level station in such relative setting positions of cam followers 38 in the rigid support plate 2 and spring 39 fitted with pin 40. A slight rearward movement of the protective film feeding means 8 upon the reversal of motor 48 disengages cam follower 38′ from cam 38, and the spring 39 urges the clamp 35 against 35A, thereby securely holding film 3 therebetween. Upon the continuing return of protective film feeding means 8 to its home position, protective film 3 is unwound from drum 55 over rollers 71, 72, 62 and between rollers 66 and 67, and undergoes static discharge treatment at 75 and a dewrinkling via press roller 77. The protective film 3 is given a certain tension by the brake controlling the rotation of the drum 55, and would be securely adhered to the rigid support plate 2 by smoothing the surface of the rigid support plate 2 with the press roller 77. Further the protective film 3 is securely adhered to the rigid support plate 2 because of the tension given by a downward tensioning motion of rollers 66 and 67 via elements 68, 63, 58/59, 60 and 61 as before mentioned. The cutter 74 is then activated at the appropriate time to cut protective film 3, whereby application is complete and protective film feeding means 8 returns to its home position and rigid support plate 2 is moved along guides 23 by transfer means 7 drawing chain 26 forward to the photosensitive material application means 9.

OVERVIEW OF PHOTOSENSITIVE MATERIAL FEEDING MEANS 9

Means 9 essentially comprises a bucket and feeding means thereof which simultaneously applies and doctors a layer of photosensitive material to the protective layer carried on the image-bearing transparency 1 as the rigid support plate 2 passes therebeneath. The bucket is tipped rearwardly to apply the photosensitive material when the leading edge of the rigid support plate 2 passing thereunder strikes cam 83 to tip the bucket, which contains a charge of photosensitive material.

DETAILED DESCRIPTION OF PHOTOSENSITIVE MATERIAL FEEDING MEANS 9

FIG. 4 shows a photosensitive material feeding means 9 which is provided between a pair of side plates 79 disposed in opposed relation on the lateral portions of the frame 22. The photosensitive material feeding means 9 comprises a bucket 80 for receiving a predetermined amount of photosensitive material which has a V-shaped cross section and which is swingable from an upright position to a rearward position. The bucket 80 has a rear edge which is located at a predetermined position and the edge serves as a doctor 81 when the bucket 80 is turned down. Referring to the operation of the bucket 80 in detail, the bucket 80 is normally maintained in the upright state by the action of a spring (not shown) so as to receive therein photosensitive material coming from a feeding pipe 82 disposed above the bucket. A gear 83A is disposed on one lateral portion of the bucket 80, and gears into rack 83B provided to the upper surface of a cam follower 83. The cam follower 83 is contacted with the rigid support 2 during transferring of the rigid support plate 2. The cam follower 83 is fitted to the opposite face of side plate 79 so as to be capable to turn down against the motion of the spring. The bucket 80 charge the photosensitive material onto the rigid support plate 2 until layer 4 having a predetermined thickness is obtained. The feeding pipe 82 supply source (feeding tank 84) is controlled in such a way that during the period from the stage of covering an image-bearing transparency 1 with the protective film 3 to the stage of causing the lateral turning of the bucket 80 to begin application of the photosensitive material, a predetermined amount of photosensitive material is fed to the bucket 80. A photosensitive material feeding tank 84 is disposed at the rear portion of the frame 22.

OVERVIEW OF BACKING MATERIAL FEEDING MEANS 10

Figure 11:
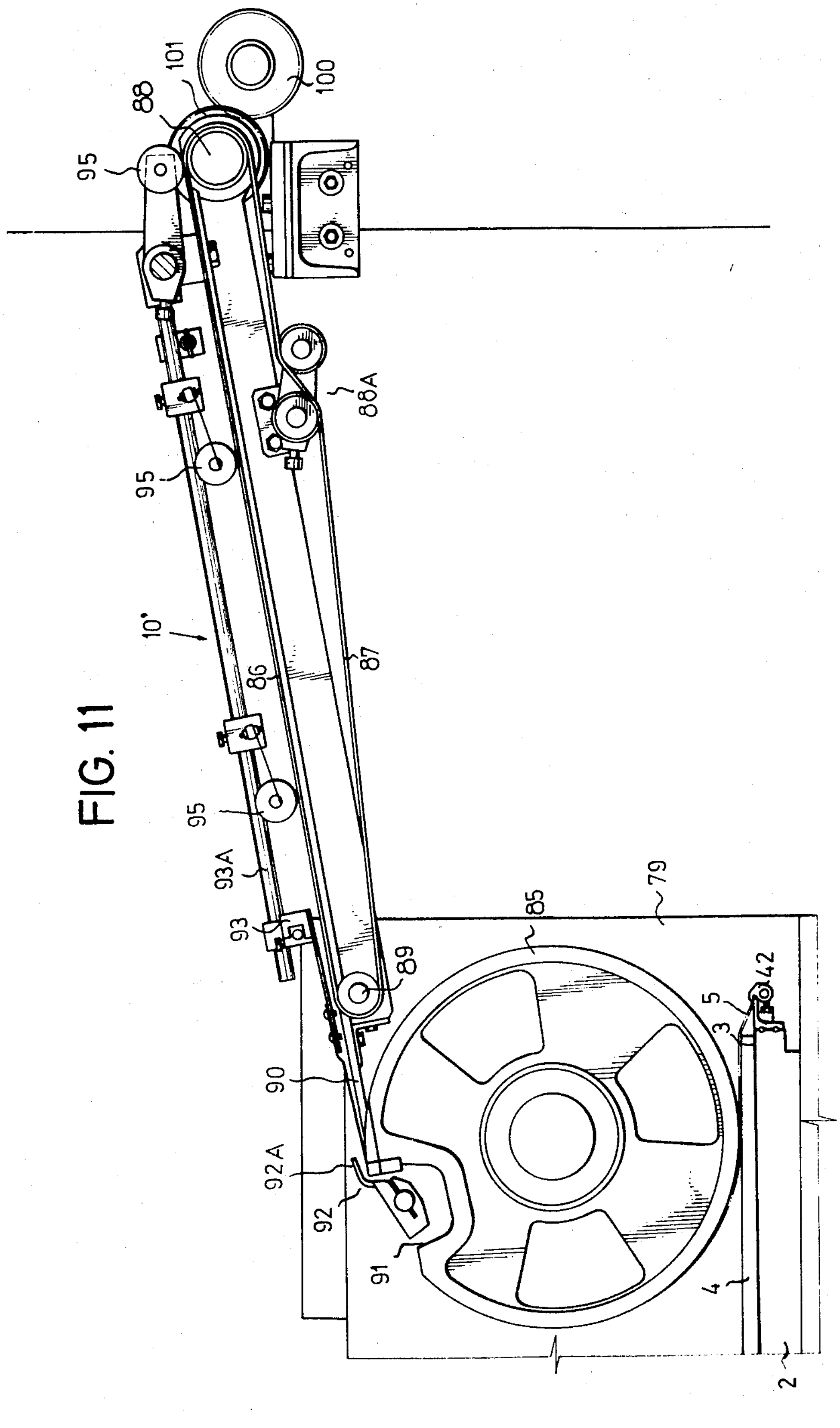
FIGS. 11 and 12 are right side view of exposure means.

This unit comprises a feeding means 10″ (see FIG. 12) and a transfer means 10′ (see FIG. 11).

In operation, at an appropriate signal or time, means 10″ is activated, i.e., as rigid support plate 2 approaches from means 9, motors 114 and 124 are activated to begin the transfer of backing material 5 and protective material to be laminated thereto from drum 116 and 120, respectively, to pass between rollers 109 and 110 where they are laminated. The laminated material then passes between rollers 108/104, etc., and passes along means 10′, i.e., along the slide plate 86 carried on belt 87. When the laminated material trips limit switch 93, cutter 97 in means 10″ is activated and an appropriate length of backing material cut. The backing material 5, retained by gripper 92A in means 10′ on laminating cylinder 85, is then carried to the low position, gripper 92A is released, and the material laminated onto the photosensitive material layer 4 passing under the laminating cylinder 85, whereafter cylinder 85 rotates to the upper position and the assembly 10′ and 10″ await in the rest position for the next process run. As explained later, grippers 42 on rigid support plate 2 are opened during this step when cam follower 44 abuts cam 94 on frame 22 to receive material 5 and grip (or clamp) the same onto the rigid support plate 2.

DETAILED DESCRIPTION OF THE BACKING MATERIAL FEEDING MEANS 10

The backing material feeding means 10′ is disposed nearly to the above-described photosensitive material feeding means 9 on the frame 22. The transfer means 10′ is provided with a laminating cylinder 85 mounted between side plates 79 at the rear portion thereof to press the backing material against the applied photosensitive material layer 4, a slide plate 86 extending toward the laminating cylinder 85 with a slope along the tangent to the top point of the cylinder 85 and two driving rollers 88, 89 respectively disposed at the uppermost and lowermost portion of the slide plate 86, the belt 87 also being provided with tensioning roller assembly 88A. A belt 87 is trained around the rollers 88 and 89 and extends therebetween as a transfer means towards the lowermost portion, the belt sliding along the upper surface of the slide plate 86. The slide plate 86 has its lowermost portion fastened to a connecting plate 90 having one end adjacent the uppermost portion of the outer periphery of the laminating cylinder 85, and which laminating cylinder has a slot 91 provided on its periphery and extending transversely thereof. The slot 91 is normally positioned upwardly when the laminating cylinder 85 is in the inoperative or stopped position. The slot 91 accommodates therein a pawl 92 which has a gripper 91A in association with the edge of the slot 91, and the pawl 92 is adapted to grip the backing material 5 when the limit switch 93, carried on a support member generally represented by 93A, is disposed upwardly by the leading end of the backing material 5 reading the end of the connecting plate 90. The pawl 92 is adapted to release the backing material 5 when the pawl comes to the lower position by the rotation of the laminating cylinder 85. The laminating cylinder 85 is rotated in synchronism with the transferring movement of the rigid support plate 2, i.e., at an equal circumferential speed to the transferring speed thereof, and thereby laminates the backing material 5 onto the surface of the photosensitive material layer 4 carried on the rigid support plate 2. The rotation of the cylinder is stopped when the pawl 92 is restored to its home position to receive further backing material 5. Numerals 95 are auxiliary roller units disposed above the belt 87 and adapted to press the backing material 5 against the belt surface with its rolling pressure.

Referring to FIG. 3, a cam 94 abutting against the cam follower 44 of the rigid support plate 2 (see FIG. 6) is provided on the frame 22 within the side plates 79, and the cam acts to open or release the gripper 42 disposed (see FIGS. 4 to 7) on the forward end of the transferring rigid support plate 2, so as to grip the leading end of backing material 5 which has been released from the pawl 92 shown in FIG. 11.

Figure 12:
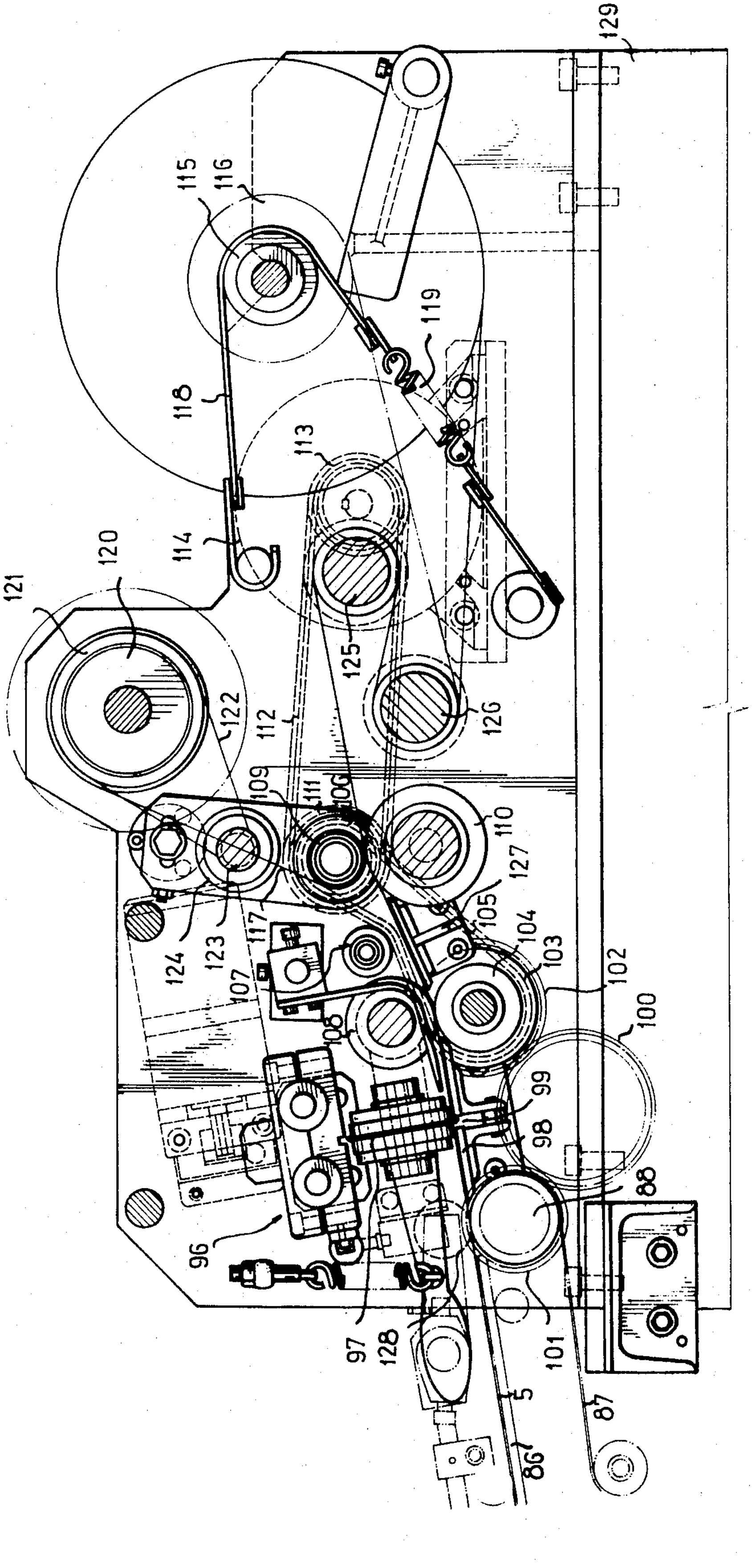

Referring now to FIG. 12, the feeding means 10″ rests above the exposure means 11 (see FIG. 2) located at the forward portion of the slide plate 86. The feeding means 10″ is interconnected with the laminating cylinder 85 so as to timely feed a predetermined length of backing material 5 to the slide plate 86 for laminating a layer 4. For this purpose, a cutter means 96 has a cutter 97 journaled above the uppermost portion of the slide plate 86. The cutter means is adapted to reciprocate in the transverse direction of the slide plate 86 when the limit switch 93 senses the leading edge of the backing material 5. The cutter 97 is rolled over by the reciprocation on a guide plate 98 which is connected to the slide plate 86, then reciprocated within a guide groove 99 formed therein to cut off the backing material 5 at a predetermined length.

Numeral 100 is a spur gear journaled below one side of the guide plate 98. The spur gear 100 gears into spur gears 101 and 102 to drive the belt 87 by motor 114, and the spur gear 101 being attached on the shaft of the roller 88. A sprocket wheel 103 and a roller 104 are fastened to the spur gear 102 coaxially therewith, and the sprocket wheel 103 is connected by means of a chain 105 with a sprocket wheel 106 journaled to the forward upper the sprocket wheel 103.

Numeral 107 is an idle wheel for imparting a tension to the chain 105.

Numeral 108 is a roller disposed above the roller 104 and it serves to exert the pressure of rolling on the roller 104. A roller 109 is rotatably mounted on the sprocket wheel 106 coaxially therewith, and a roller 110 is journaled below the roller 109 so as to exert the pressure of rolling the roller 109.

Adjacent to the sprocket wheel 106, a sprocket wheel 111 is attached coaxially therewith, and the sprocket wheel 111 is associated with a sprocket wheel 113 by way of a chain 112 connected therebetween. The sprocket wheel 113 is attached to an output shaft of a motor 114 provided with a gearing unit which motor 104 is arranged on the lateral portion of the feed means 10″.

The motor 114 is actuated prior to the start of the transferring movement of the rigid support plate 2 and stops in synchronism with appropriate sensing of the limit switch 93 of the backing material 5.

A drum 116 equipped with a brake wheel 115 is journaled inside the feeding means 10'' arranged above the exposure means 11, and the drum 116 carries the backing material 5 wound therearound in the counterclockwise direction, the backing material 5 having an inner surface laminated with a film 117 for covering an adhesive agent applied surface thereof.

The drum 116 is controlled by a band brake 118 trained around the brake wheel 115 so as to impart a desired tension to the backing material 5 to be unwound therefrom. Numeral 119 is a tension spring disposed on the low tension side of the band brake 118.

A drum 120 is journaled above the roller 109, and on one side of the drum 120 a pulley 121 is attached coaxially therewith. The pulley 121 is interconnected with a pulley 123 by way of a belt 122 trained around these pulleys, and the pulley 121 is fastened to an output shaft of a motor 124 arranged on the same side as the motor 114.

Numerals 125 and 126 are rollers disposed between the roller 109 and the drum 116.

Numeral 127 is a guide plate arranged between the rollers 104 and 110, and numeral 128 is a roller disposed on the roller 88 to apply there to the pressure of rolling.

OVERVIEW OF THE EXPOSURE MEANS 11

Figure 13:
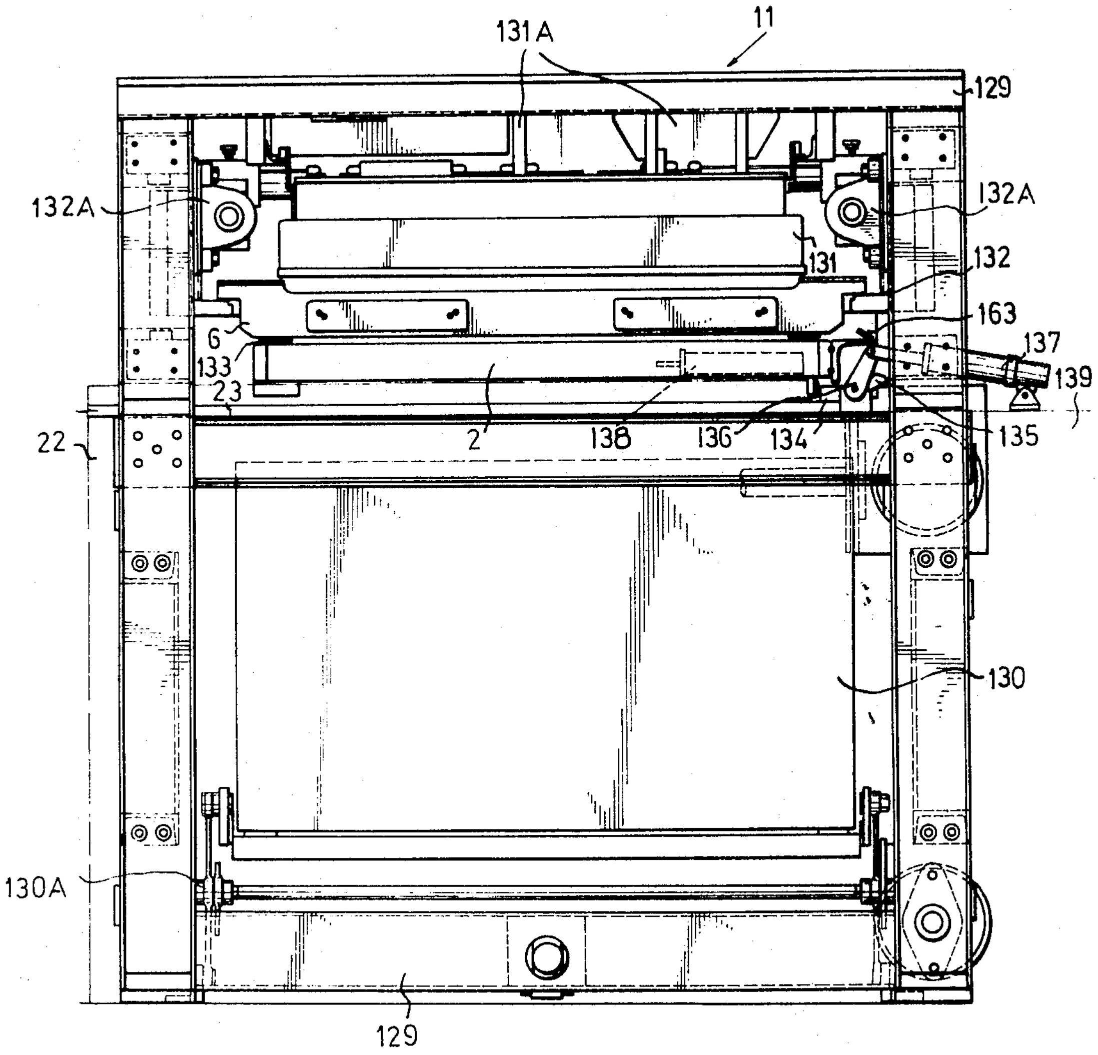

The exposure means 11, best shown in FIG. 13, has two primary functions. First, to expose the photosensitive layer 4, and secondly, to co-act with the rigid support plate 2 to release materials 3 and 5 in sequence to gripper means 155, as later explained.

The primary elements of the exposure means 11 are: (a) upper and lower exposure means 130 and 131; (b) a rigid plate 6 which approaches the upper surface of the rigid support plate 2 spaced therefrom by a spacer 133; and means which co-act both with rigid support plate 2 and the gripper means 155, as generally described in the preceding paragraph, all carried on a frame.

DETAILED DESCRIPTION OF THE EXPOSURE MEANS 11

Referring now to FIG. 13, there is shown the exposure means 11 provided at the forward portion of the frame 22. Numeral 129 is a frame which extends above and below the frame 22. The frame 129 has a lower light source 130 and an upper actinic light source 131 of any type as heretofore mentioned. An anti-halation curtain (not shown) is provided beneath the upper actinic light source 131 for covering the upper actinic light source 131 during exposing for the layer 4 to actinic radiation from the side of the rigid support plate 2. Between the upper light source 131 and the rigid support plate 2 located in the exposure means, a rigid plate 6 is disposed with the forward and rear ends secured to the lower ends of a pair of rods 132, the rods 132 being adapted to vertically move to a predetermined position by means of a rack and pinion mechanism 132A by sliding in the frame 129. When the rods 132 come down to their lowered positions, the spacing to be formed between the lower surface of the rigid plate 6 and the upper surface of a rigid support plate 2 is ensured by a spacer means 133 disposed at the lower surface of the rigid plate 6.

Numeral 134 is a stopper adapted to abut against the forward lower end of the rigid support plate 2 to position the rigid support plate 2 in place between the upper and lower actinic light sources 131 and 130.

The construction of the rigid plate 6, although no details are illustrated in the drawing, is identical with that of the rigid support plate 2. Namely, the rigid plate 6 has on its lower surface a rigid plate fitted to a slit-like groove provided circumferentially of the frame thereof, and through the groove compressed air is fed or a vacuum is pulled by an air cylinder or vacuum means (not shown) provided in the exposure means 11. The rigid plate fixed in the rigid plate 6 is capable of transmitting actinic radiation therethrough.

The rigid plate 6 and the rigid plate are typically glass sheets or plate and it is preferred to employ ground glass sheets or plate from the point of view of more intimately contacting the rigid plate with the backing material.

A cam 135 is journaled to the lateral front portion of the frame 22 within the frame 129, and a lower end of lever 136 is fastened the journal pin of the cam 135. The lever 136 is coupled to one end of the piston of an air cylinder 137 journaled to the frame 22, and the cylinder 137 is operated to cause the cam 135 to abut against the cam follower 44 of the rigid support plate 2 transferred by the means 7, schematically shown in FIG. 13, so as to open the gripper 42 for pulling out the backing material 5 by gripper means 155, as later explained.

On the other lateral forward portion of the frame 22, an air cylinder 138 is provided, and the air cylinder 138 is actuated to press the rod 34 (see FIGS. 4 and 7) to open the clamp of the rigid support plate 2 formed by 35–35A when the backing material 5, after being subjected to the exposure, is slightly pulled forward. In this manner, since clamp 35–35A holds protective film 3 for a slightly longer period than grippers 42 hold backing material 5, the leading edge of protective film 3 is slightly separated from the photosensitive layer 4 to permit the easy removal thereof by protective film removing means 12, as explained below.

OVERVIEW OF PROTECTIVE FILM REMOVING MEANS 12

This means co-acts with the gripper means 155 as later described in detail to remove the protective film 3 from bottom of the photosensitive material 4. Essentially speaking, as shown in FIG. 14, two rotating belts (142 -see FIG. 15 for an upper view) peel the protective film 3 from the photosensitive material 4 / backing layer 5 combination, while they are held by the gripper means by rotating in a direction opposite the direction of travel of the photosensitive material 4 / backing means 5 assembly.

DETAILED DESCRIPTION OF PROTECTIVE FILM REMOVING MEANS 12

Figure 14:
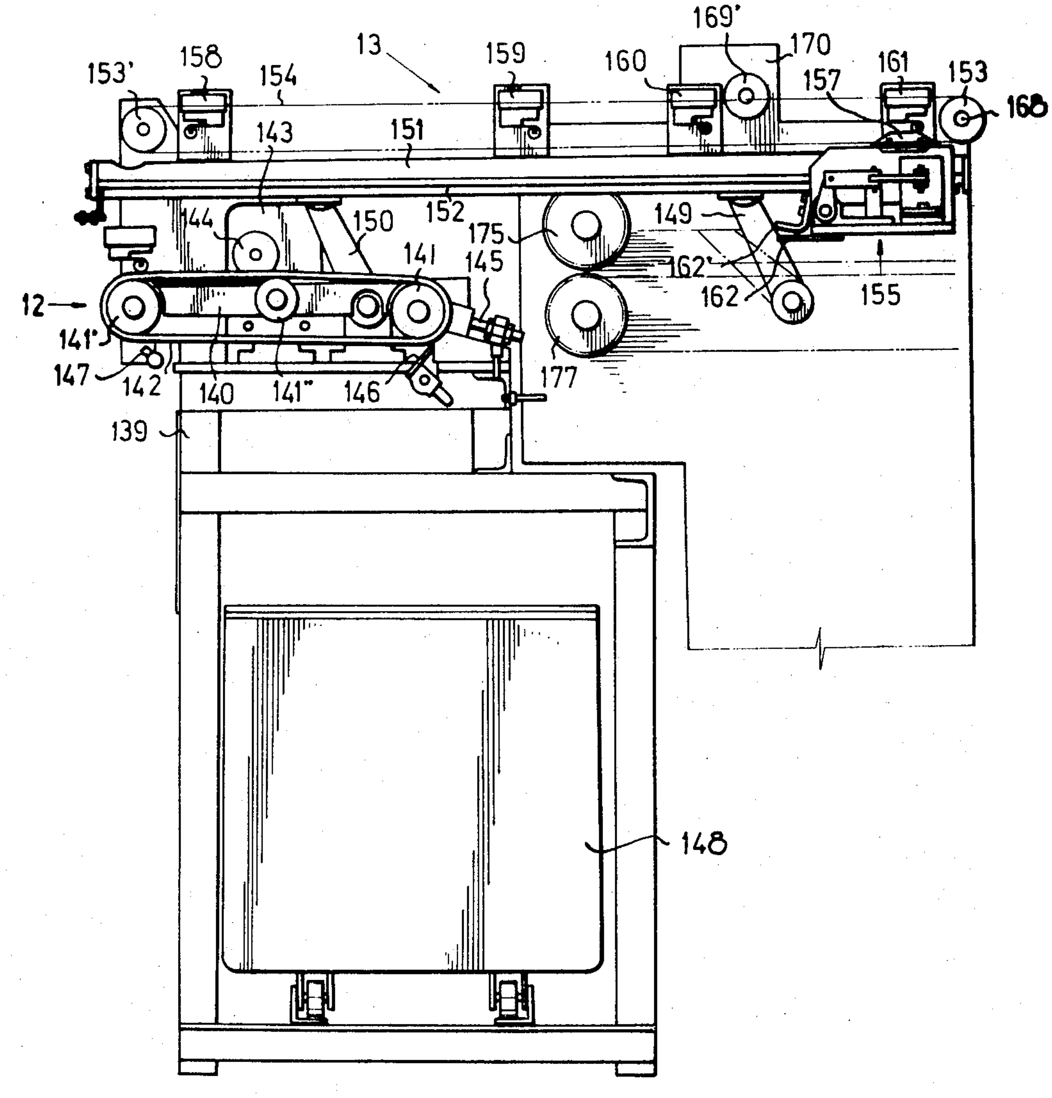
FIGS. 14 and 16 are right side views of a protective film removing means and a fragmentary enlarged front view of the transfer means.
Figure 15:
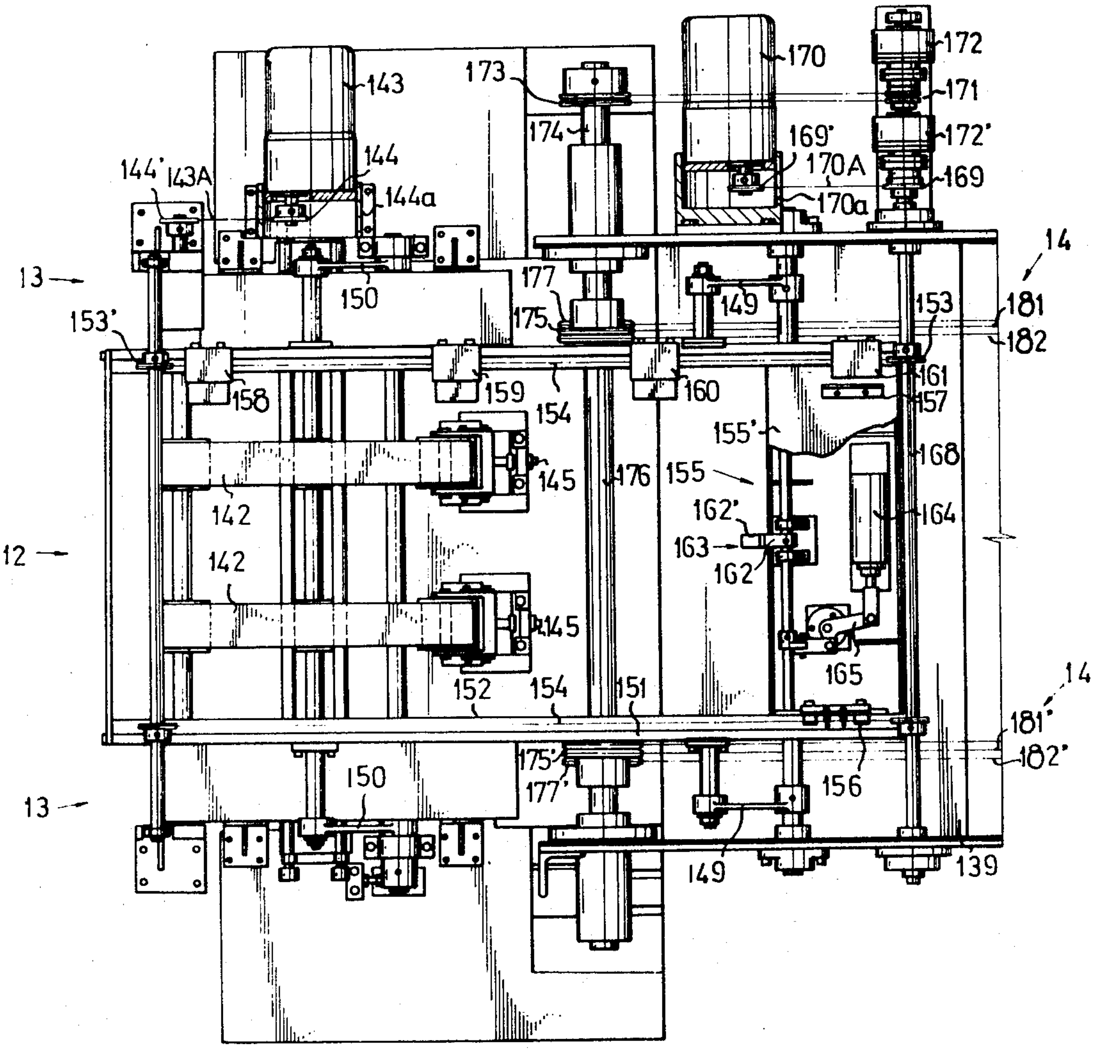
FIG. 15 is a top view, partially fragmented, of a protective film removing means and transfer means.
Figure 16:
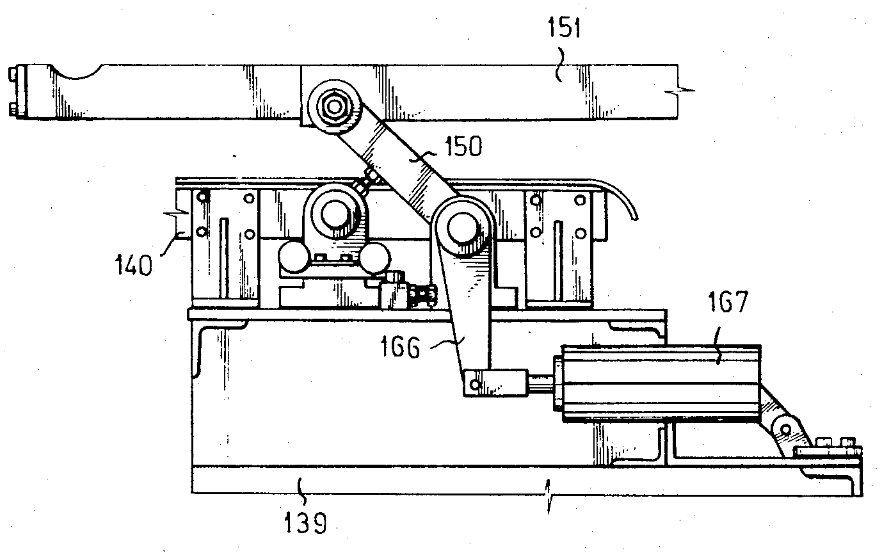

Referring now to FIGS. 14 to 16, there is shown a protective film removing means 12. A frame 139 of this means 12 connected to the forward end of the frame 22 has a pair of left and right retaining members 140 disposed at the upper portion of the frame 139. Rollers 141 and 141' are journaled to the front and rear ends of retaining members 140. A belt 142 having an adhesive surface is trained around each pair of rollers 141, 141' and extends therebetween with the forward portion slightly lowered relative to the rearward portion to securely remove the protective film 3. A roller 141'' is journaled at the central portion of the retaining member 140, and the roller 141'' is in pressure-contact with the reverse or inner face of the belt 142. Therefore the belt 142 is securely given a rotational force in the counter-clockwise direction in FIG. 14 by a sprocket wheel 144 on an output shaft of a motor 143 arranged on one side of the central portion of the retaining member 140, the sprocket wheel 144 being linked by a (not shown) which is fastened to the rotational shaft of the pair of left and right rollers 141'.

Numeral 145 is a tension control means disposed on the retaining member 140 and adapted to pull the rollers 141 forward thereby applying a desired tension to the belt 142. Numeral 146 is a scraper disposed below the belt 142 and the roller 141. Numeral 147 is a compressed air nozzle arranged rearward of the belt 142. Numeral 148 is an air tank accommodated within the frame 139.

The position of the belt 142 is controlled so as to have a predetermined distance between the upper surface thereof and the backing material 5 facing in the downward direction.

OVERVIEW OF THE TRANSFER MEANS 13

Referring to FIGS. 14, 15 and 16, the transfer means, which essentially removes the photosensitive material-backing layer - protective film from the rigid support plate after exposure, passes the assembly over the protective film removal means 12 to permit protective film 3 to be "removed off" the exposed photosensitive material, and delivers the exposed photosensitive film and backing layer to the transfer means 14 for forwarding to the final exposed photosensitive layer treatment steps, can be viewed as comprising a gripper means 155 which reciprocates horizontally along vertically movable guides, going rearward and downward to pull the photosensitive material etc., from the rigid support plate, passing over the means 12 to permit removal of the protective film 3, and then adjusting its speed to that of the transfer means 14, releasing the photosensitive material and backing layer onto the transfer means 14 and then lifting itself upward and forward so as to not interfere with the travel of the photosensitive material, etc., in the transfer means 14.

The transfer means 13 thus co-acts with rigid support plate 2 to receive the protective film 3, exposed photosensitive material 4 and backing material 5 at exposure means 11, co-acts with means 12 for removal of layer 3 and finally with transfer means 14.

The transfer means can be partially broken into the following interacting components:

a. vertical orientation means (the levers 149 and 150 powered by cylinder 167);

b. horizontal orientation means (the chain 154 driven by motor 170 via wheels 153, etc.);

c. control means, which tell the assembly when to lower, stop, decelerate, etc., (limit means 158 – 161 in combination with sensing post 157);

d. grippers which grip the backing material 5, 163.

DETAILED DESCRIPTION OF TRANSFER MEANS 13

Referring to FIGS. 14 to 16 in explaining the transfer means 13, and referring initially to FIG. 14 two couples of rotatable links 149 and 150 are journaled in paralled relationship with each other to the front and rear portions of frame 139 to raise and lower the actual transfer-device. A pair of guide 149 and 150 are mounted between the couples of rear and front links 149, 150. The pair of guide rails 151 are connected at their front and rear ends with each other so as to be maintained horizontal when guide rails 151 are moved upward or downward. The link 150, as best seen in FIG. 16, is coupled to a lever 166 journaled to the frame 139, and the lever 166 is coupled to the end of the piston of an air cylinder 167 journaled at its rear end to the frame 139 to effect the raising and lowering of the gripper means. The guide rails 151 have ridges 152 provided along the opposite faces of the guide rails 151. Front and rear sprocket wheels 153, 153' (toward wash-out means) are provided above the guide rails 151. Numeral 154 is a chain trained around both sprocket wheels 153, 153' and extended therebetween to rotate the sprockets wheels 153, 153' in synchronism.

Between the guide rails 151 there is provided a gripper means 155 having a casing 155' equipped with a pair of upper and lower rollers 156 at its both sides which engage ridges 152 of guide rails 151 so as the move the casing 155' its therealong while suspended therefrom.

The casing 155' of gripper means 155 is secured at the upper side to the chain 154 so that the gripper means 155 can reciprocate in response to movement of the chain 154, along the guide rails 151.

Numeral 157 is a contact piece provided on the upper surface of the casing 155' of the gripper means 155. The guide rails 151 have four limit switches 158, 159, 160 and 161 disposed thereon between the front and rear ends thereof, and each of limit switches has a contact adapted to sense the contact piece 157 of the gripper means 155. The operation of respective limit switches is effected in such way that the limit switches 158 and 161 positioned at both ends act to stop the gripper means 155 at the rear and front ends of the guide rails 151, while the limit switch 159 serves to lower the gripper means 155 to the position of an initial level in the process of returning movement thereof, and the limit switch 160 acts to decelerate the moving speed of the gripper means 155 in the process of the transferring movement so that the speed of the gripper means 155 is equal to that of the transfer means 14 (later explained), whereby the backing material 5 carrying the exposed photosensitive material thereon in a downward direction is smoothly and accurately passed from the gripper means 155 to the transfer means 14 for transfer to the final processing means 15, 16 and 17. This is necessary because the gripper means rapidly removes these elements from the rigid support plate 2 after the exposure, but the transfer means 14 is traveling at a relatively slower rate.

The gripper means 155 (in FIGS. 15 and 16) includes plural grippers 163 set on the casing 155' and each of the grippers backed to the exposure means 11 consists of a lower tongue 162' secured to the casing 155' and an upper tongue 162 connected to a link mechanism 165 which is operated by an air cylinder 164 housed within the casing 155' to hold the backing material 5 between the lower and upper tongues.

In the starting position of the grippers 163, after the gripper means 155 is in position with the rigid support plate 2 for removal of the backing material, photosensitive layer and protective film, the grippers 163 are located with their tongues open in the cut-out portions 35*a* of the rigid support plate 2 located in the exposure means 11 (see FIG. 5).

Couples of sprocket wheels 153 and 153′ are attached to rotational shaft 168 mounted between guide rails 151 and are energized by the rotational force from a reversely rotatable motor 170 to drive gripper means 155 along the guide rails 151. The sprocket wheel 169′ is connected by a chain to a sprocket wheel 169 mounted on one end of the rotational shaft 168. The sprocket wheels 144′, 169 follow the vertical downward movement of the guide rails 151, and the sprocket wheels 144 and 169′ are rotatably connected with then by chains 143A, 170A respectively and securely moved in guide frames 144a, 170a used in combination as a motor retainer.

The time of operation of the transfer means 13 is adjusted by a number of timers incorporated therein (not shown). In detail, the grippers 163 are closed simultaneously with the release of the gripper 42 of the rigid support plate 2 and are opened when a predetermined time elapses after the deceleration of the transferring speed of the gripper means 155, according to the information of the limit switch 160. The gripper means 155 initiates its returning movement after the lapse of predetermined time after exposure.

The guide rails 151 are lifted when a predetermined timepasses after the grippers 163 of gripper means 155 in the advancing movement are opened. In this connection, the protective film removing means 12 is initiated into operation by a timer a predetermined interval of time often the termination of the advancing movement of the gripper means 155 and stopped with the returning of the gripper means 155 to its home position which is shown in FIG. 15. In operation, the gripper means 155 withdraw the backing material 5 from the rigid support plate 2 very rapidly. It is in the lowered position. It then goes forward horizontally and passes the means 12 over the means 12 while it is still in the lowered position, whereby the protective film 3 is removed. The gripper means 155 then gets to the transfer means 14. It is still in the lowered position. By this time it has slowed down to the speed of the transfer means 14. The grippers 163 open. At this stage, the gripper means 155 will still be beneath the backing material 5. The gripper means 155 then start to accelerate forward and rise so that it is out of the travel path of the backing material 5 and rise vertically.

OVERVIEW OF TRANSFER MEANS 14

As explained in detail, the transfer means essentially comprises an upper rotating chain and a lower rotating chain couple, one couple on each side of the backing material 5, the backing material 5 essentially being held by both lateral edges between the upper and lower chains in the couple (see chains 181/182, 181′/182′ in FIGS. 14 and 17), having been delivered between the chains in the couple by the gripper means 155, which thereafter releases the backing material 5 and is lifted up and away out of the path of travel.

Figure 17:
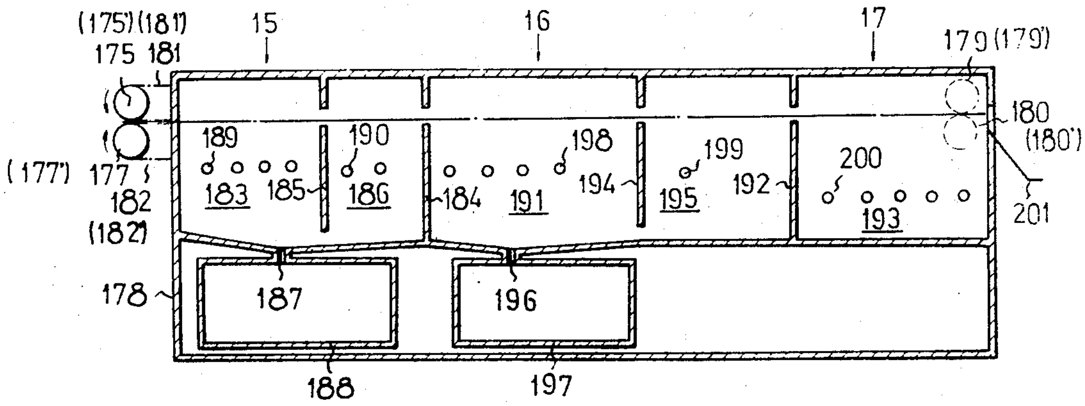
FIG. 17 is a side view diagrammatically showing washing-out, surface treating and post-exposure means.

The rearward end of the chains is mounted at the frames 139 (see sprockets wheels 175 and 177 in FIG. 14 for one side) and the forward side of chains at the end of the processing line is mounted at the frame 178 (see sprocket wheels 179′ and 180′ in FIG. 17).

DETAILED DISCUSSION OF THE TRANSFER MEANS 14

Referring to FIGS. 14, 15 and 17, there is also shown the transfer means 14. The means 14 includes a sprocket wheel 171 and an electromagnetic clutch 172 connected endwise to the rotational shaft 168, the sprocket wheel 169 also being equipped with an electromagnetic clutch 172′. The electromagnetic clutch 172 serves to cut off transmission of the driving force to the sprocket wheel 171 when the gripper means 155 returns to its home position, while the electromagnetic clutch 172′ acts to cut off transmission of the rotational force to the rotational shaft 168 after the termination of the transferring movement of the gripper means 155.

The sprocket wheel 171 is connected by a chain to a sprocket wheel 173 journaled to the frame 139 between the limit switches 159 and 160, and the sprocket wheel 173 has a rotational shaft 174, to one side of which a sprocket wheel 175 is fastened. A sprocket wheel 175′ opposite to the sprocket wheel 175 is journaled to the frame 139 on the other side of guide rails 151, and below both sprocket wheels 175 and 175′, double wheel sprocket wheels 177 and 177′ are connected by a rotational shaft 175 common thereto.

The couples of sprocket wheels 175, 177 in vertical arrangement (as shown in FIG. 17, the sprocket wheel 175 is arranged above the sprocket wheel 177) are given a rotational force at an equal circumferential speed by spur gears (not shown) which are fastened to the rotational shafts 174 and 176 and are geared into each other. In the operation of the transfer means 14 driven by the motor 170, when the electromagnetic clutch 172 cuts off the force to the sprockets 171, the rotational force of shaft 176 is stopped, and sprocket wheels 175 – 177′ are no longer driven, whereby the transfer means 14 is halted.

The frame 139 of the means 13 is connected to a frame 178 (see FIG. 17) carrying the washing-out means 15, the surface treatment means 16 and the post-exposure means 17, as shown in detail in FIG. 17.

The frame 178 includes couples of sprocket wheels 179, 179′ and 180, 180′ journaled to the front portion of both sides of the frame, corresponding with the couples of sprocket wheels 175, 175′ and 177, 177′, respectively. Chains 181, 181′ are geared into the sprocket wheels 175 and 179, 175′ and 179′, respectively, and extend between each couple of sprocket wheels, and chains 182, 182′ extend between the sprocket wheels 177 and 180, 177′ and 180′, gearing into chains 181 and 181′, respectively.

The construction of chains in gearing into each other is such that with regard to the chains 181 and 182, two sheets of coupling plates connected in opposed relation by pins of the chain 181 engage the coupling plates continuous to the chains 182.

The backing material 5 is larger than the photosensitive layer 4 in width. One side of the backing layer is thus supported between chains 181 and 182 and the other side between chains 181′ and 182′, and in this manner is transferred betweeen the chains from the gripper means 155 to and through procession stations 15, 16 and 17 to 201. The level of the central portion between the upper and lower chains should be adjusted to be on the same level with the grippers 163 when the backing material 5 is received between the chains.

OVERVIEW OF RELATIONSHIP BETWEEN MEANS 11, 12, 13 AND 14

The gripper means 155 is at rest in the upward, forward position near limit switch 161. A signal that a rigid support plate 2 is approaching exposure means 11 activates the transfer means 13, which initiates the rearward horizontal motion of gripper means 155. When member 157 reaches limit switch 158, a signal is generated so cylinder 167 rotates arms 149 and 150 to lower rails 151, and gripper means 155 continues to move to limit switch 158. Cylinder 167 is activated to close the grippers 163, which now grasp backing material 5 in the slots 35A in member 35, backing material 5 being released by grippers 42 via the action of cylinder 137 moving cam 135 to abut cam follower 44.

Exposure is then conducted.

The gripper means 155 then goes forward (towards 161) horizontally along rails 151 powered by motor 170, etc., and, as earlier explained, layer 3 is removed as the gripper 155 brings layer 3 into contact with belt 142. Layer 3 hangs down at its forward edge since cylinder 138 which opens the clamp at 35–35A is activated a very short time after backing layer 5 withdrawal starts.

The gripper means 155, still carrying the photosensitive material 4 and the backing layer 5, reaches transfer means 14 after it's speed has been adjusted to that of the transfer means 14, releases the backing layer 5 when grippers 163 are opened, and begins to move up and forward via the action of arms 149 – 150 and motor 170, respectively. The gripper means 155 is finally returned to its upper, forward position to await a new signal that a plate 2 approaches exposure means 11, whereby the above process is repeated.

OVERVIEW OF THE FINAL TREATING MEANS 15, 16 AND 17

The backing material 5 (with the photosensitive layer 4 facing downwardly) is gripped by its lateral portions by the chain couples earlier discussed and sequentially carried through the washing out means 15, where unhardened portions of the layer 4 are treated for removal, surface treatment means 16, where the relief is treated and post-exposure means 17, where fine dots or lines are hardened, finally being delivered to holder 201.

DETAILED DESCRIPTION OF FINAL TREATING MEANS 15, 16 AND 17

Referring now to FIG. 17, there is shown the washing-out means 15, surface treatment means 16 and post-exposure means 17. The washing-out means 15 has a chamber divided from the surface treating means 16 by a partition 184, and the chamber is divided by a partition 185 into a chamber 183 and a chamber 186. The partitions 184 and 185 have a spacing capable of transferring the backing layer 5 by chains. Both chambers communicate with each other through the lower portion below the partition 185, and also with a tank 188 housed in the lower portion of the frame 178 by way of a discharge port 187 provided at the bottom of the washing-out chamber. The chamber 183 houses a group of nozzles 189 arranged in four rows transverse to the transfer direction of the chains and the group of nozzles are adapted to spray a liquid for washing out unhardened non-exposed areas of the layer 4. The chamber 186 accommodates, in the lower portion thereof, pipe-hole type nozzles 190 adapted to blow compressed air onto the relief image areas thus formed from the layer 4 to remove the liquid adhered to the relief image areas. With respect to the surface treatment means 16 wherein the surface treatment is applied to the formed relief image areas, the surface treatment means 16 has a chamber divided from the post-exposure means 193 by a partition 192, and the chamber is divided by a partition 194 into a chamber 191 and a chamber 195. The partitions 192 and 194 have a spacing capable of transferring the backing layer 5 by chains. Both chambers communicate with each other through the lower portion below the partition 194 and also with a tank 197 arranged at the lower portion of the frame 178 by way of a discharge port 196 provided at the bottom of the surface treatment chamber. The chamber 191 houses at its lower portion a group of pipe-hole type nozzles 198 for the spraying of surface treating agent. The chamber 195 houses, at its lower portion, a pipe-hole type nozzle 199 for blowing compressed air to remove the surface treating agent adhered to the lower surface of the layer 4. With respect to the post-exposure means 17, and post-exposure chamber 193 is located at the upper portion of the foremost portion of frame 178. The post-exposure chamber 193 is adapted to harden small dots or fine lines existing in the relief image areas. Numeral 201 is a plate for receiving thereon the photopolymer plate (P) produced by the process.

In the operation of the above-described automated apparatus, the protective film feeding means 8 first starts its advancing movement to a position above the rigid support plate 2 having an image bearing transparency 1 placed on the upper surface thereof.

Before the means 8 reaches rigid support plate 2 having the image-bearing transparency 1 thereon, the cam follower 70 on means 8 abuts cam 70' on the frame 22, thereby moving arm 69 back and upward. This motion is transmitted as a downward tensioning motion to rollers 66 and 67 via elements 68, 63, 58/59, 60 and 61 during the continuing return of means 8. The protective film 3, now positioned above the clamp 35–35A maintained half open by cam 38' on the frame 47 forcing cam follower 38 on the rigid support plate upwardly and forward, is subjected to a blast of compressed air from nozzle 78 on the frame 47 and falls into the clamp space between 35 and 35A. The motion of the spring 39 is converted into the closing motion at the clamp 35 from the opening motion at the clamp 35, when cam followers 38 are rotated to the level station in such relative setting positions of cam followers 38 in the rigid support plate 2 and spring 39 fitted with pin 40. A slight rearward movement of the protective film feeding means 8 upon the reversal of motor 48 disengages cam follower 38' from cam 38, and the spring 39 urges the clamp 35 against 35A, thereby recurely holding film 3 therebetween. Upon the continuing return of protective film feeding means 8 to its home position, protective film 3 is unwound from drum 55 over rollers 71, 72, 62 and between rollers 66 and 67, and undergoes static discharge treatment at 75 and a dewrinkling via press roller 77. The protective film 3 is given a certain tension by the brake controlling the rotation of the drum 55, and would be securely adhered to the rigid support plate 2 by smoothing the surface of the rigid support plate 2 with the press roller 77. Further the protective film 2 is securely adhered to the rigid support plate 2 because of the tension given by a downward tensioning motion of rollers 66 and 67 via elements 68, 63, 58/59, 60 and 61 as before mentioned. The cutter 74 is then activated is then activated at the appropriate time to cut protective film 3, whereby application is complete and protective film feeding means 8 returns to its home position and rigid support plate 2 is moved along guides 23 by transfer means 7 drawing chain 26 forward to the photosensitive material application means 9.

The protective film 3 thus fed onto the rigid support plate 2 is subjected to a vacuum through the groove 19 on the frame 20 of the rigid support plate 2 upon the completion of feeding the protective film 3 onto rigid support plate by the means 8 and is fed onto the rigid support plate 2 in the course of the feeding of the film 3. Hence, the protective film fed onto the rigid support plate 2 is maintained in a state of tension until exposure by the vacuum pulled thereon.

Simultaneously, when the protective film feeding means 8 is returned to its home position, the rigid support plate 2 starts to transfer on the frame 22 by the operation of the transfer means 7. In the process of transferring, the photosensitive material feeding means 9 and the backing material feeding means 10 are actuated. In detail, the bucket 80 applies the photosensitive material when the leading edge of the rigid support plate 2 passing thereunder strikes cam 83 to tip the bucket, which contains a charge of photosensitive material. In this case, the layer 4 of the photosensitive material fed on the protective film 3 is leveled to a predetermined thickness by the doctor 81, in the process of transferring the rigid support plate 2.

On the other hand, the laminating cylinder 85, upon sensing the rigid support plate 2, rotates to bring the leading end of the backing material 5 which has been cut to a predetermined length on the slide plate 86 to the forward end of the transferring the rigid support plate 2. At this time, the gripper 42 attached to the forward edge of the rigid support plate 2 is opened by the action of the cam 94 to receive therein the leading end of backing material 5, and then closed to grip it. Thus, the backing material 5 with the leading end thereof gripped by the forward end of rigid support plate 2 is subjected to the pressure of the laminating cylinder 85 rotating at a circumferential speed equal to the transferring speed of the rigid support plate 2, to thereby be laminated on the upper surface of the layer 4.

By virtue of the application of an adhesive agent to the reverse or contacting surface of the backing material, the laminating of the backing material to the upper surface of the layer 4 is facilitated.

After the backing material 5 is laminated to the upper surface of the layer 4, the rigid support plate 2 further is transferred to the exposure station, and then is topped by the transfer means 7 operating in response with the information of a limit switch (not shown) incorporated in the exposure means 11.

Simultaneously with the stopping of the rigid support plate 2, the air cylinder 137 brings the cam 135 into abutment against the cam follower 44, to thereby open the gripper 42, while the air cylinder 164 causes the link mechanism 165 to operate so as to close the grippers 163 for holding the leading end of backing material 5.

When the rigid support plate 2 is positioned in the exposure means 11, the rigid plate 6 having a spacer means 133 on its lower surface is lowered onto the backing material 5 to contact the spacer means on the upper surface of the rigid support plate 2, so as to hold the backing material 5 down on the rigid support plate 2. The backing material 5 is subjected to pull a vacuum through the groove of the rigid plate 6, and thus fastened on the upper surface of the layer 4 is subjected to exposure to actinic radiation through the rigid plate 6. The backing material 5 is securely adhered to the layer 4 through the upper exposure, relief image areas are formed through the lower exposure, and then with these stabilized exposures the relief image areas are clearly formed. An adhesive agent applied to the lower surface of the backing material which contacts the layer 4 serves to remarkably increase the bonding strength to a greater extent. Subsequently, image areas (corresponding to the image-bearing transparency 1) are formed in the layer 4 by exposure to actinic radiation through the rigid support plate 2. The relief images R thus formed each have a cross section of isosceles trapezoid. The formation of reliefs R is ensured by the provision of the anti-halation curtain disposed below the lower surface of the light actinic source 131 above the backing material 5, as well as by the operation of a limit switch (not shown). Thereafter, the vacuum which has been to the protective film 3 and the backing material 5 through the grooves of the rigid support plate 2 and the rigid plate 6 is stopped, the compressed air is ejected through the grooves 19, and the rigid plate 6 is raised from the upper surface of the backing material 5 to its home position. Simultaneously with the above movement, the gripper means 155 starts its transferring movement to pull layers out forwardly from between the rigid support plate 2 and the rigid plate 6. While the layer 5 is being pulled out, the air cylinder 138 is actuated to release the clamp of the rigid support plate 2. Consequently, the protective film 3 is also taken off the rigid support plate 2, together with the layer. In this case, the leading end of the protective film 3 is separated from the layer 4 to the pendent state, because of the time lag in the pulling-out of the protective film 3.

The grippers 42 of the rigid support plate 2 are closed after the layer 5 is removed, and the rigid support plate 2 is caused to return by the operation of the transfer means 7 to its initial position.

The transferring speed of the backing material 5 thus pulled out is decelerated to the transferring speed of the chain of the transfer means 14, when the limit switch 160 has sensed the gripper means 155. Accordingly, the backing material 5 is transferred with its the lateral portions held between the chains 181 and 182, 181' and 182'. When a predetermined time has elapsed after the deceleration of the transferring speed of the backing material 5, the grippers are caused to opened, and after the further lapse of a predetermined time, the air cylinder 167 is operated to lift the guide rails 151, whereupon the gripper means 155 comes away from the forward portion of the backing material 5 is lifted above the backing material 5, and is then restored to its initial speed and stopped at the forward end of guide rails 151 by the action of the electromagnetic clutch 172', which cuts off the transmission of the driving force thereto according to the information of the limit switch 160. Hence, the backing material 5 is then transferred with no interference from the gripper means 155.

The gripper means 155 initiates its return movement to exposure means 11 by the reverse rotation of the motor 170 driven by rendering the electromagnetic clutches 172 and 172' inoperative and operative, respectively, after a elapse of time until the backing material 5 is taken out onto the receiver plate 201. In the course of the return movement of the gripper means 155, the gripper means 155 is lowered by the operation of the air cylinder 167 acting to return the gripper means 155 to its initial position when the limit switch 159 has sensed the gripper means 155, and is returned to the initial position to stop thereat.

On the other hand, in the protective film removing means 12, when a predetermined amount of time has passed since the termination of the returning movement of the gripper means 155, first the belt 142 of the protective film removing means 12 starts to move in the counter-clockwise direction as shown in FIG. 14. At this time, since the leading end of protective film 3 has separated from the layer 4 due to the time lag between the commencement of the removal of the layer 5 and the release of the clamp of the rigid support plate 2, it is brought into abutment with the upper surface of the belt 142, the protective film 3 is caused to completely separate from the layer 4, and to adhere to the surface of the belt 142 for rotating therewith. When the protective film 3 comes to the lower portion of the rear roller 141', the protective film 3 on the belt 142 is subjected is separated from the belt 142 into the tank 148 by the injection of compressed air from the nozzle 147.

Should the separation of the protective film 3 from the belt fail at this stage, the attendant scraper 146 located below the forward roller 141 will still assure the separation of the protective film 3. The time of operation of the belt 142 and the nozzle 147 is controlled by timers.

Now, in process of transferring the backing material 5, reliefs are formed on the layer 4 adhered to the backing material 5, then followed by detachifying or more completely hardening the relief images, the thus obtained photopolymer plate (P) is taken out. In this apparatus, for producing the photopolymer plate (P) it is noted that the protective film feeding means 8 and the transfer means 13, after the completion of their operation, are restored to their home positions to be ready for the subsequent operation, and other means 14 through 17 thereafter are usually maintained in their operable position. In addition, all means constituting this apparatus are in interconnecting relationship with one another. Therefore the production of photopolymer plate (p) having an image areas is effected in a continuous operation and the all-over apparatus can be operated by only single operator. This serves to improve the efficiency in the printing operation and to facilitate the elimination of hand labor.

In the apparatus described, supplying the image-bearing transparency 1 with the film 3 is described for the case where the rigid support plate 2 is stopped and the film feeding means 8 effects a reciprocating movement, but it is also practical to allow both the rigid support plate 2 and the protective film feeding means 8 to relatively reciprocate.

Although the invention has been particularly shown and described, it is contemplated that various changes and modification may be made without departing from the scope of the invention as set forth in the following claims.

What is claimed is:

1. An automated apparatus for producing a photopolymer plate having relief images areas which comprises:

a. rigid support plate for receiving an image-bearing transparency and a protective film thereon, said rigid support plate and said protective film being capable of transmitting actinic radiation therethrough;

b. means for covering said image-bearing transparency with said protective film in intimate contact therewith said means being capable of effecting relative reciprocating movement in relation to said rigid support plate;

c. means for feeding a liquid photosensitive material onto said protective film to form a layer of photosensitive material;

d. means for laminating a backing material onto said layer of photosensitive material, said backing material being capable of transmitting actinic radiation;

e. exposure means including a rigid plate, and being adapted to receive said rigid support plate below said rigid plate, and said exposure means further comprising an upper actinic light source and a lower actinic light source being provided on a frame of said exposure means, said rigid plate being provided on a frame of said exposure means, said rigid plate being capable of transmitting actinic radiation;

f. actuating means for transferring said rigid support plate from a protective film feeding station to an exposure station, and for successively operating said liquid photosensitive material feeding means and said laminating means during the transference of said rigid support plate to said exposure station;

g. means for removing said protective film from the lower surface of said exposed layer;

h. means for removing unhardened non-exposed portions in said layer to form relief images on said backing material at a washing-out station;

i. means for treating said relief images on said backing material;

j. means for subjecting said relief images to the post-exposure;

k. means for transferring said backing material from a washing-out station through the post-exposure station.

2. An apparatus as claimed in claim 1 wherein said rigid support plate is glass plate.

3. An apparatus as claimed in claim 2 wherein said rigid support plate is ground glass plate.

4. An apparatus as claimed in claim 1 wherein said rigid plate in said exposure means is glass plate.

5. An apparatus as claimed in claim 4 wherein said rigid plate is ground glass plate.

6. An apparatus as claimed in claim 1 wherein said protective film feeding means comprises:

a. means adapted to open or release a clamp when said means is located above the rigid support plate, said clamp being provided at a forward portion of said rigid support plate having a circumferential groove for applying pressure or pulling a vacuum;

b. press roller attached at the lower portion of said means and adapted to press the upper surface of the rigid support plate;
c. guide roller adapted to be adjacent to the upper surface of the rigid support plate for guiding a leading end of protective film loosely in pendent state near the vicinity of the clamp when said means is located above said rigid support plate;
d. air ejection nozzle for blowing the leading end of protective film into said clamp and,
e. cutter means provided between said press roller and said guide roller and adapted to cut the protective film being guided by said rollers, immediately before said means comes apart from the rigid support plate.

7. An automated apparatus as claimed in claim 6, wherein said guide roller is lowered to give the tension to a protective film held with said clamp at the leading end before said protective film is cut with said cutter means.

8. An apparatus as claimed in claim 1, wherein said photosensitive material feeding means and said backing material feeding means are actuated after one another according to the advance of the rigid support plate equipped with the clamp at its forward edge; said photosensitive material feeding means comprises a bucket; and said backing material feeding means comprises a laminating cylinder for laminating the backing material on the photosensitive material surface;
a. said bucket for receiving photosensitive material is in operative condition, and having one edge serving as a doctor edge when said bucket is tipped sideways upon perceiving the approach of said rigid support plate;
b. said laminating cylinder having grippers disposed at its upper portion in its stationary condition, said grippers being adapted to hold therein the leading end of said backing material being transferred, and adapted to be released to deliver said backing material into said grippers of the rigid support plate.

9. An apparatus as claimed in claim 1, wherein said exposure means comprises:
a. an upper and lower actinic light sources provided at an upper position and a lower position of said rigid support plate having separably therein an image-bearing transparency and the photosensitive material superposed on the backing material;
b. an anti-halation curtain disposed below said upper actinic light source and adapted to block said upper actinic light source for a duration of the lower exposure by said lower actinic source; and,
c. a rigid plate provided between the upper actinic light source and the rigid support plate set in said means, and adapted to be lowered to the upper surface of said rigid support plate to thereby hold said backing material and said photosensitive material on said rigid support plate.

10. An apparatus as claimed in claim 1, wherein said rigid plate in said exposure means has a spacer on its lower surface.

11. An apparatus as claimed in claim 1, wherein said protective removing means comprises;
a. a transfer means equipped with the gripper holding therein the leading end of said backing material having a protective film on its lower surface, said transfer means being adapted to hold the leading end of said backing material for pulling out backing material from the rigid support plate;
b. a belt provided downwardly of said transfer means and having an adhesive surface, said belt being provided adjacently to said means in the opposite direction of travel transfer of said transfer means; and,
c. a nozzle and a scraper sequentially disposed in fixed position adjacent to said belt.

12. An apparatus as claimed in claim 1, wherein said transfer means comprises;
a. a first transfer means adapted to hold said backing material for pulling out said material from between said rigid plate and said rigid support plate; and,
b. a second transfer said backing material after said material is drawn out from the rigid support plate until said material having photosensitive material is taken out as a photopolymer plate having relief image areas;
c. said second transfer means including upper and lower chains having plates arranged in meshing relation with one another and engaging to couple both sides of the backing material, in the travelling direction thereof, to thereby hold said backing material; and,
d. said first transfer means accelerating forward and rising out of the path of said backing material.

* * * * *